(12) United States Patent
Meng et al.

(10) Patent No.: US 10,720,550 B2
(45) Date of Patent: Jul. 21, 2020

(54) LIGHT EMITTING DIODE AND METHOD OF FABRICATING THE SAME

(71) Applicant: XIAMEN SANAN OPTOELECTRONICS TECHNOLOGY CO., LTD., Xiamen (CN)

(72) Inventors: Cheng Meng, Xiamen (CN); Chun-Yi Wu, Xiamen (CN); Shufan Yang, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 4 days.

(21) Appl. No.: 16/138,985

(22) Filed: Sep. 22, 2018

(65) Prior Publication Data

US 2019/0027648 A1 Jan. 24, 2019

Related U.S. Application Data

(63) Continuation of application No. PCT/CN2017/097840, filed on Aug. 17, 2017.

(30) Foreign Application Priority Data

Dec. 22, 2016 (CN) .......................... 2016 1 1196635

(51) Int. Cl.
*H01L 33/22* (2010.01)
*H01L 33/38* (2010.01)
(Continued)

(52) U.S. Cl.
CPC .............. *H01L 33/22* (2013.01); *H01L 33/38* (2013.01); *H01L 33/387* (2013.01);
(Continued)

(58) Field of Classification Search
CPC .............. H01L 33/36–387; H01L 33/22; H01L 33/00–33/648; H01L 21/30604–30635
See application file for complete search history.

(56) References Cited

U.S. PATENT DOCUMENTS

| 2006/0255358 A1* | 11/2006 | Shum ..................... H01L 33/387 257/99 |
| 2009/0045434 A1* | 2/2009 | Muraki ................... H01L 33/22 257/103 |

(Continued)

FOREIGN PATENT DOCUMENTS

| CN | 104064642 A | 9/2014 |
| CN | 104167477 A | 11/2014 |
| CN | 105845801 A | 8/2016 |

*Primary Examiner* — Eric A. Ward
*Assistant Examiner* — Eric K Ashbahian
(74) *Attorney, Agent, or Firm* — Syncoda LLC; Feng Ma

(57) ABSTRACT

A method of fabricating an LED includes: providing an epitaxial structure having a growth substrate, a first-type semiconductor layer, an active layer and a second-type semiconductor layer; forming an extended electrode and performing thermal treatment to form ohmic contact with the second-type semiconductor layer; providing a temporary substrate bonded with the epitaxial structure, and removing the growth substrate to expose the surface of the first-type semiconductor layer; forming an ohmic contact layer, a mirror layer and a bonding layer over the exposed surface of the first-type semiconductor layer; providing a conductive substrate bonded with the bonding layer, and removing the temporary substrate to expose part of the surface of the second-type semiconductor layer and the extended electrode; forming a roughening surface via etching of the exposed second-type semiconductor layer; and providing a bonding wire electrode forming a closed loop with the extended electrode.

10 Claims, 30 Drawing Sheets

(51) Int. Cl.
*H01L 33/40* (2010.01)
*H01L 33/44* (2010.01)
*H01L 33/30* (2010.01)

(52) U.S. Cl.
CPC ............ *H01L 33/405* (2013.01); *H01L 33/30* (2013.01); *H01L 33/44* (2013.01); *H01L 2933/0016* (2013.01); *H01L 2933/0058* (2013.01); *H01L 2933/0066* (2013.01)

(56) References Cited

U.S. PATENT DOCUMENTS

| | | | |
|---|---|---|---|
| 2010/0201254 A1* | 8/2010 | Matsumura | H01L 33/387 313/501 |
| 2011/0095306 A1* | 4/2011 | Hwang | H01L 33/38 257/79 |
| 2011/0193119 A1* | 8/2011 | Chen | H01L 33/46 257/98 |
| 2013/0244360 A1* | 9/2013 | Sato | H01L 33/12 438/29 |
| 2014/0124798 A1* | 5/2014 | Wang | H01L 33/38 257/88 |
| 2014/0367722 A1* | 12/2014 | Im | H01L 33/0079 257/98 |
| 2018/0026162 A1* | 1/2018 | Seong | H01L 33/0062 257/13 |

* cited by examiner

LIGHT EMITTING DIODE AND METHOD OF FABRICATING THE SAME

CROSS-REFERENCE TO RELATED APPLICATIONS

The present application is a continuation of, and claims priority to, PCT/CN2017/097840, filed on Aug. 17, 2017, which claims priority to Chinese Patent Application No. CN 201611196635.9, filed on Dec. 22, 2016. The disclosures of the above applications are hereby incorporated by reference in their entirety.

BACKGROUND

Light-emitting diodes (LEDs), due to such electrical and optical advantages as low energy consumption, long service life, good stability, small size, fast response and stable luminous wave length, are widely applied in fields like lamination, household appliance, display and indicator.

A p-side-up AlGaInP-based light-emitting diode appears with the development of substrate transfer technology. In such kind of light-emitting diode, the growth substrate is removed through twice substrate transfer. A conductive substrate is bonded with one side of the n-type semiconductor, and a bonding pad electrode 142 and an extended electrode 141 are arranged on the surface 120a of the p-type semiconductor. Large power devices usually adopt enclosed designs for the bonding pad electrode and the extended electrode, as shown in FIG. 1. During fabrication, the bonding pad electrode and the extended electrode are simultaneously fabricated on the p-type semiconductor and thermally treated under high temperature to form ohmic contact, followed by substrate bonding to realize low-temperature bonding of the substrate. This avoids the influence of high-temperature thermal treatment on the substrate bonding and on the reflectivity of the reflective substrate.

SUMMARY

To improve light emitting efficiency, in general, a roughening surface is fabricated over the light emitting surface of the device to increase light extraction efficiency. During roughening of the p-type face-up device, a bonding pad electrode and an extended electrode are directly formed as the mask layers for roughening. The inventors of the present disclosure have recognized that, however, as electrode material is magnetic, a certain magnetic field is formed as the bonding wire electrode and the extended electrode form a series of closed loop. During roughening, charged particles in the roughening solution cut magnetic line so that charged particles of different electrical properties in the roughening solution deviate by a certain direction in respective magnetic field, thus influencing roughening effect. Meanwhile, the extended electrode, which is not protected, is prone to lateral erosion. When the roughening solution etches to the lower part of the extended electrode, it is likely to cause fragile metal contact or lift-off.

The present disclosure relates to a semiconductor fabrication field, and more particularly, to a light-emitting diode and fabrication method thereof.

Various embodiments of the present disclosure provides a light-emitting diode that improves luminance and fabrication method thereof. Prior to roughening, an extended electrode is fabricated; the bonding pad electrode is fabricated after roughening to prevent the electrode from forming a closed loop during roughening, which influences roughening effect.

In an aspect, a fabrication method of light-emitting diode is provided, comprising: (1) providing an epitaxial structure, comprising a growth substrate, a first-type semiconductor layer, an active layer and a second-type semiconductor layer in successive; (2) forming an extended electrode over the surface of the second-type semiconductor layer and performing thermal treatment to form ohmic contact with the second-type semiconductor layer; (3) providing a temporary substrate, which is bonded with the epitaxial structure, and removing the growth substrate to expose the surface of the first-type semiconductor layer; (4) forming an ohmic contact layer, a mirror layer and a bonding layer over the exposed surface of the first-type semiconductor layer in successive; (5) providing a conductive substrate, which is bonded with the bonding layer, and removing the temporary substrate to expose part of the surface of the second-type semiconductor layer and the extended electrode; (6) forming a roughening surface via chemical etching of the exposed second-type semiconductor layer; and (7) forming a bonding wire electrode over the surface of the second-type semiconductor layer, which forms a closed loop with the extended electrode.

In some embodiments, a metal mask layer is formed above or below the extended electrode in step (2), in which, area of the metal mask layer is larger than that of the extended electrode.

In some embodiments, thickness of the metal mask layer formed in step (2) is 10-200 nm, and in some embodiments 50-100 nm.

In some embodiments, the edge of the metal mask layer formed in step (2) extends beyond the edge of the extended electrode by at least 2 μm, and in some embodiments 2-10 μm.

In some embodiments, material of the metal mask layer formed in step (2) is Au, Cr, Ni, Ti or Pd.

In some embodiments, thermal treatment temperature in step (2) is above 300° C.

In some embodiments, the extended electrode is directly formed as the mask layer in step (6) for the roughening etching of the surface of the second-type semiconductor layer.

In some embodiments, at first, a mask layer of photoresist layer is formed in the bonding pad electrode area in step (6) before etching.

In some embodiments, an insulating layer is formed as the mask layer in the bonding pad electrode area before etching in step (6); and a bonding pad electrode is directly formed over the insulating layer in step (7).

In another aspect, a light-emitting diode (LED) fabricated according to the method disclosed in the present disclosure is provided. In yet another aspect, a light-emitting system is provided including a plurality of the LEDs. The light-emitting system can be used for display, lighting, signage, etc.

At least some of the embodiments of the present disclosure can have one or more of the following advantageous effects: (1) The bonding pad electrode and the extended electrode are fabricated separately, namely, the extended electrode is fabricated before roughening while the bonding pad electrode is fabricated after roughening. This prevents the bonding pad electrode area and the extended electrode area from forming a closed loop during roughening etching. As a result, charged particles in the roughening solution would undergo random and free motion instead of directional motion as influenced by magnetic field, thus improving the roughening ratio of the light emitting surface and the light extraction rate of LED; (2) the metal mask layer is used as the protection layer in the extended electrode area so that the fabrication of the mask layer is prior to the substrate bonding process, which eliminates the affect from dislocation of yellow light alignment; in addition, the metal mask layer is not etched during roughening, addressing erosion of the extended electrode and avoiding fragile metal contact or lift-off.

The other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

In addition, it should be understood by those skilled in the art that despite many problems in the prior art, the technical scheme of each embodiment or claim of the present disclosure can be improved in one or several aspects. It is not necessary to solve all technical problems listed in the prior art or the background art. It should be understood by those skilled in the art that contents not mentioned in a claim shall not be construed as limiting the claim.

BRIEF DESCRIPTION OF THE DRAWINGS

The accompanying drawings, which are included to provide a further understanding of the disclosure and constitute a part of this specification, together with the embodiment, are therefore to be considered in all respects as illustrative and not restrictive. In addition, the drawings are merely illustrative, which are not drawn to scale.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

Figure 1:
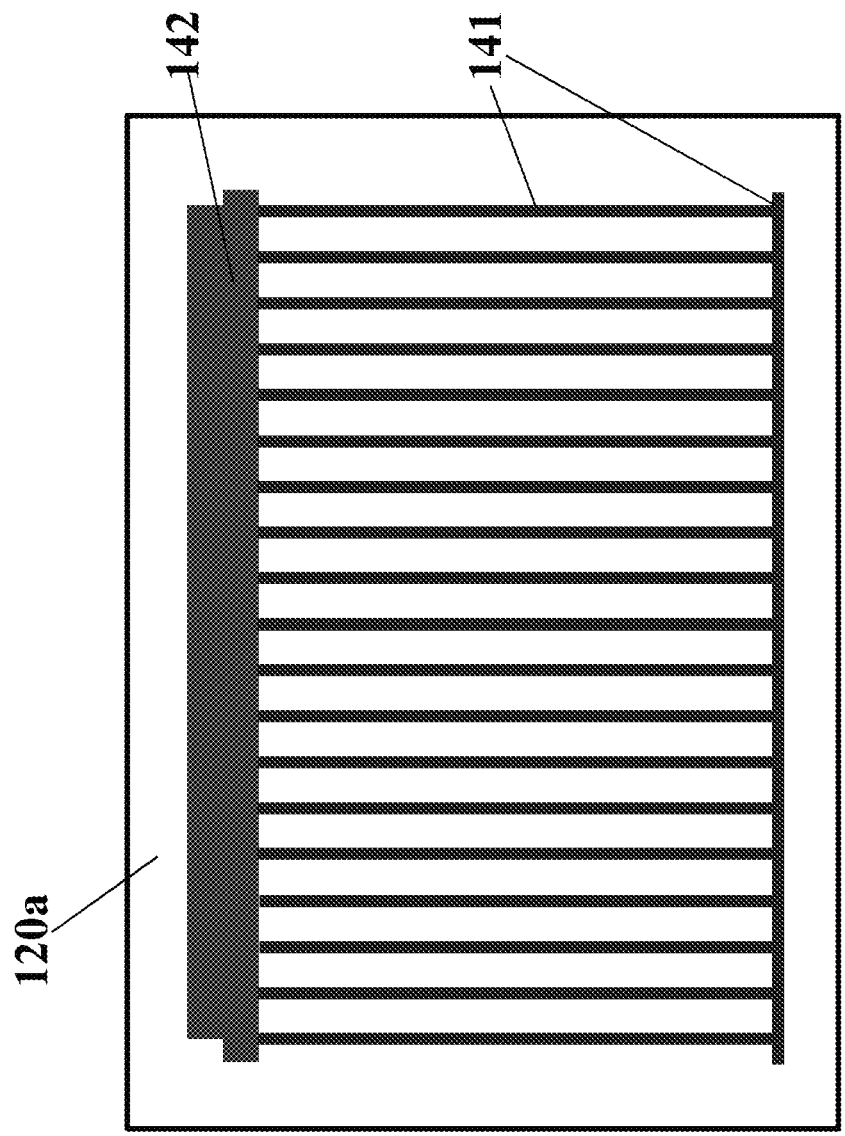
FIG. 1 is a diagram of an electrode of a p-side-up light-emitting diode.
Figure 2:
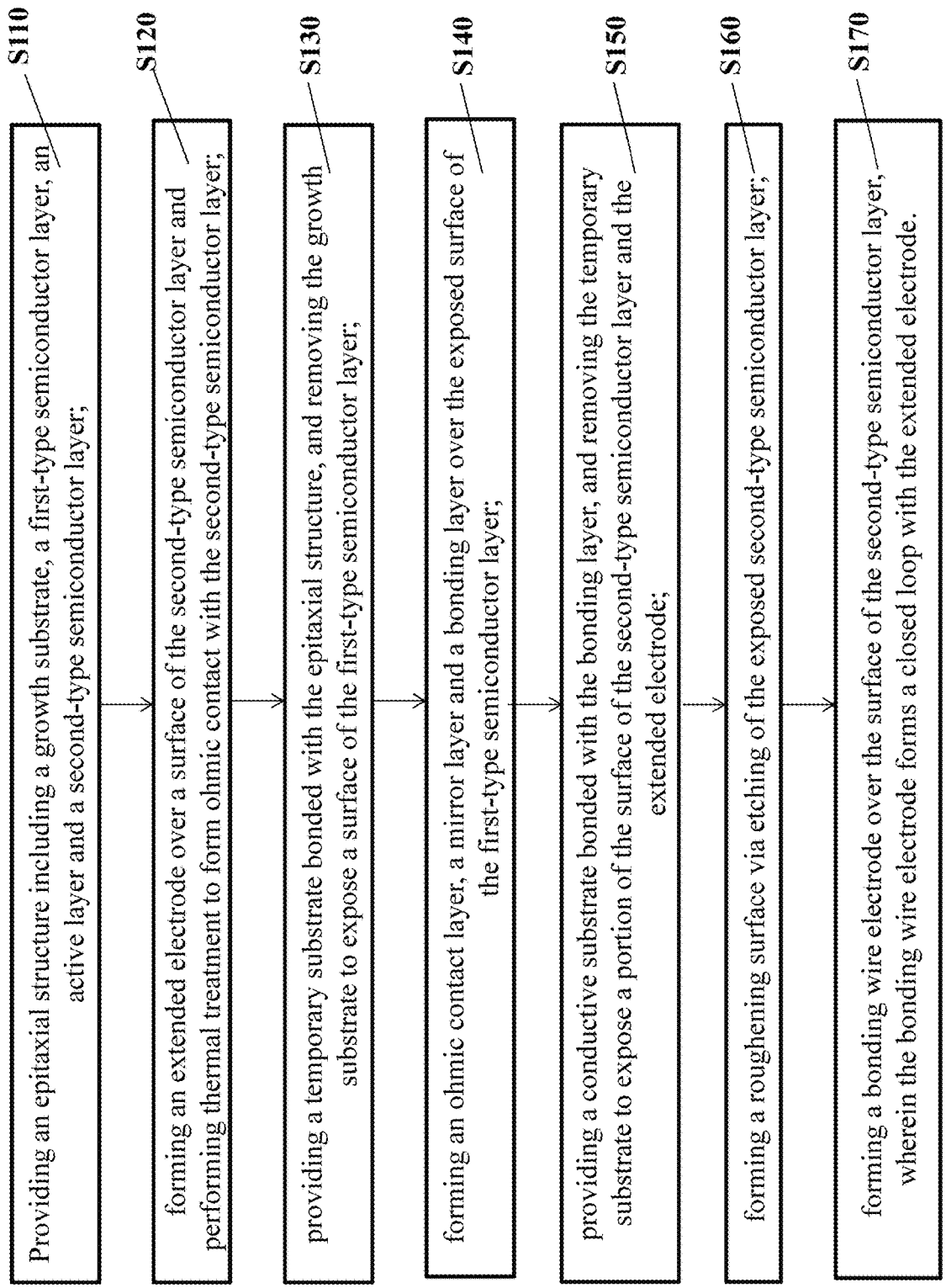
FIG. 2 is a fabrication flow diagram of a light-emitting diode according to some embodiments.

FIG. 2 is a fabrication flow diagram of a light-emitting diode according to a first preferred embodiment of the present disclosure, mainly comprising Steps S110-S170. Details are given below by taking a quaternary light-emitting diode as an example with a combination of FIGS. 2-15.

Figure 3:
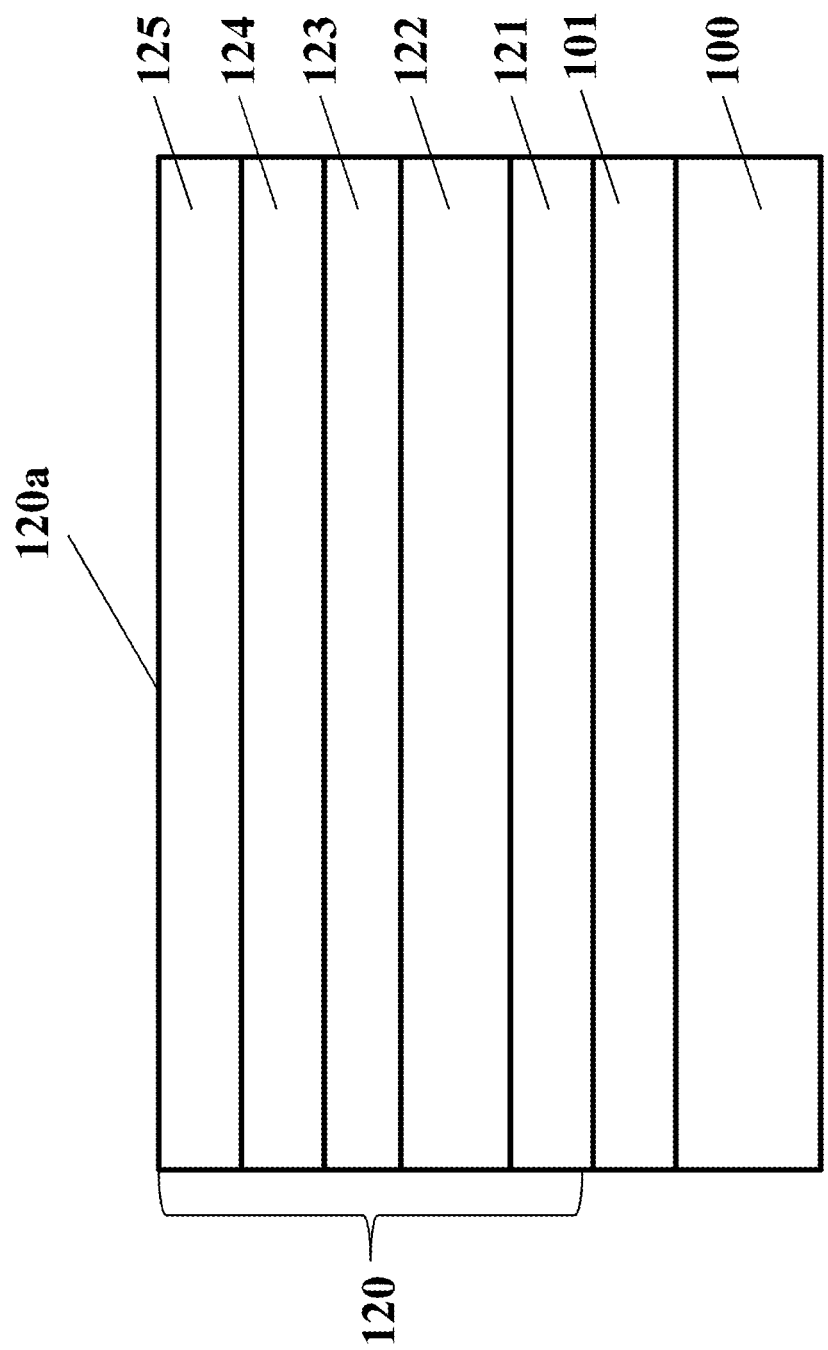
FIG. 3 illustrates a first step of fabricating the LED according to embodiment 1.

Step S110: provide a growth substrate 100, over which, form a light-emitting epitaxial structure 120. In some embodiments, the growth substrate 100 is made of III-V-group compound semiconductor material, such as GaAs, InP, GaP or sapphire; and the light-emitting epitaxial structure is a conventional epitaxial structure, generally comprising an n-type semiconductor layer, an active layer and a p-type semiconductor layer. Specifically, at first, provide a growth substrate 100, and directly grow an etching stop layer 110 over the surface of the growth substrate 100, for example, via depositing. Then, form an n-type ohmic contact layer 121 over the etching stop layer 101, in which, material of the n-type ohmic contact layer 121 can be GaAs, GaAsP or AlGaInP. Next, grow a light-emitting epitaxial structure 120 over the n-type ohmic contact layer 121, and in some embodiments, the light-emitting epitaxial structure 120 comprises an n-type confinement layer 122, an active layer 123, a p-type confinement layer 124 and a window layer 125 orderly laminated over the surface of the n-type ohmic contact layer 121, as shown in FIG. 3. Material of the N-type confinement layer 122 can be AlGaAs ($Al_xGa_{1-x}As$, x>0.4) or AlGaInP (($Al_xGa_{1-x})_yIn_{1-y}P$, x>0.4); material of the p-type confinement layer 124 can be AlGaAs ($Al_xGa_{1-x}As$, x>0.4) or AlGaInP (($Al_xGa_{1-x})_yIn_{1-y}P$ x>0.4); material of the active layer 123 can be AlGaInP (($Al_xGa_{1-x})_yIn_{1-y}P$, x<0.5); and material of the window layer 125 can be GaP, GaAsP, AlGaAs or AlGaInP.

Figure 4:
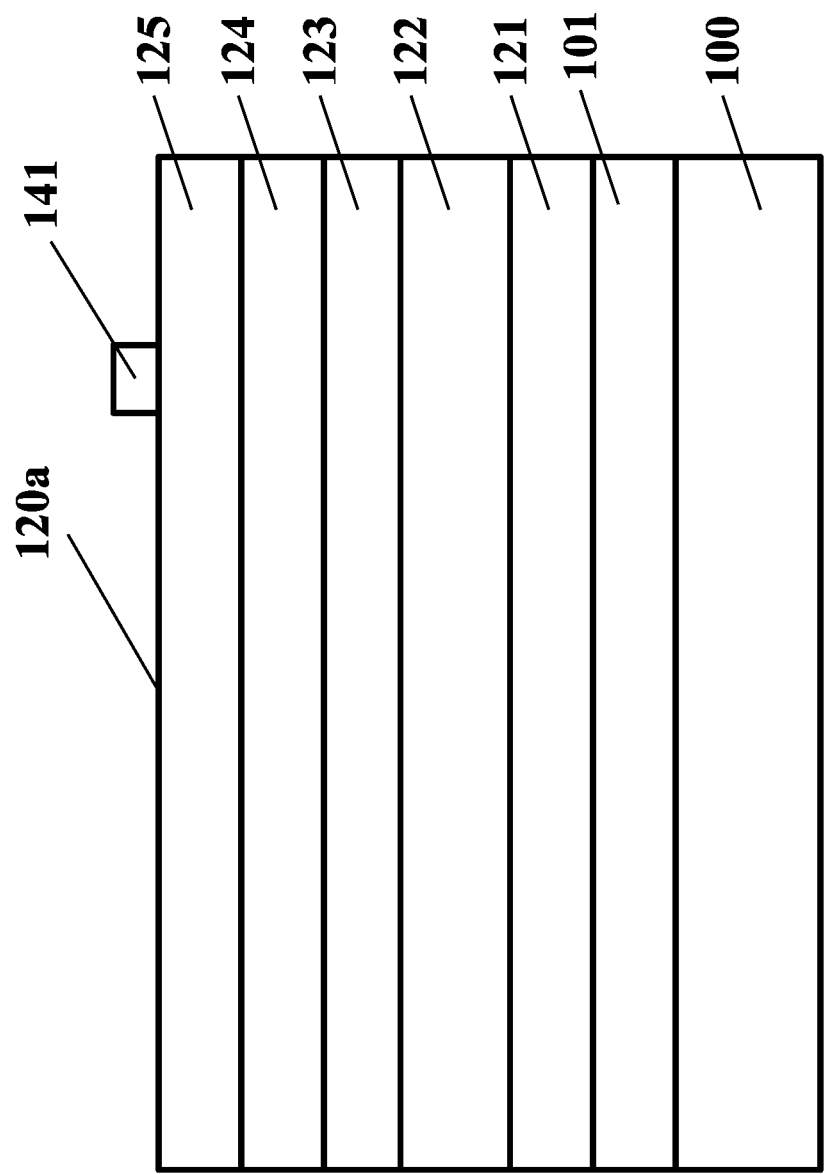
FIG. 4 illustrates a second step of fabricating the LED according to embodiment 1.
Figure 5:
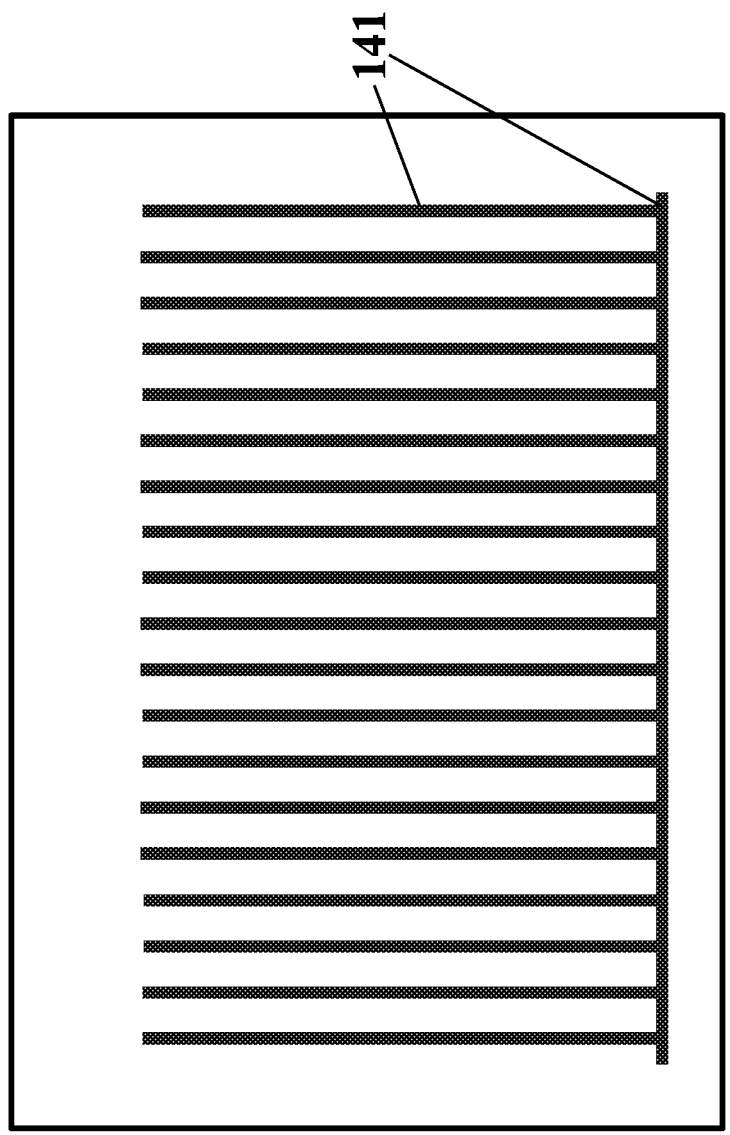
FIG. 5 illustrates a third step of fabricating the LED according to embodiment 1.

Step S120: fabricate an extended electrode layer 141 over the surface 120a of the light-emitting epitaxial structure, and perform thermal treatment under high temperature to form ohmic contact with the window layer 125, as shown in FIG. 4. The extended electrode 141 appears a finger-like structure, and forms no closed loop, as shown in FIG. 5. Selected materials include Au—Be alloy, Au—Zn alloy or Au—Cr alloy. Thermal treatment temperature is above 300° C., and in some embodiments 480° C.

Figure 6:
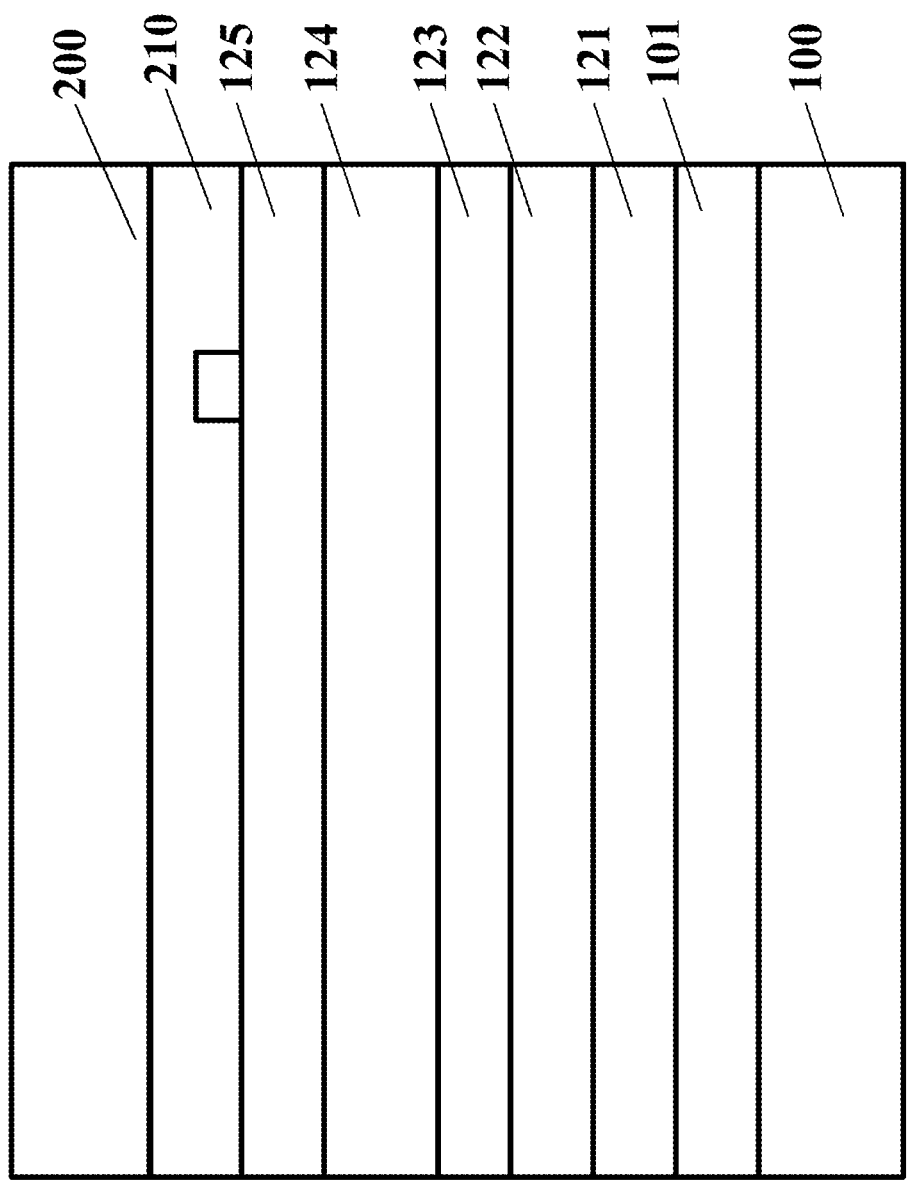
FIG. 6 illustrates a fourth step of fabricating the LED according to embodiment 1.
Figure 7:
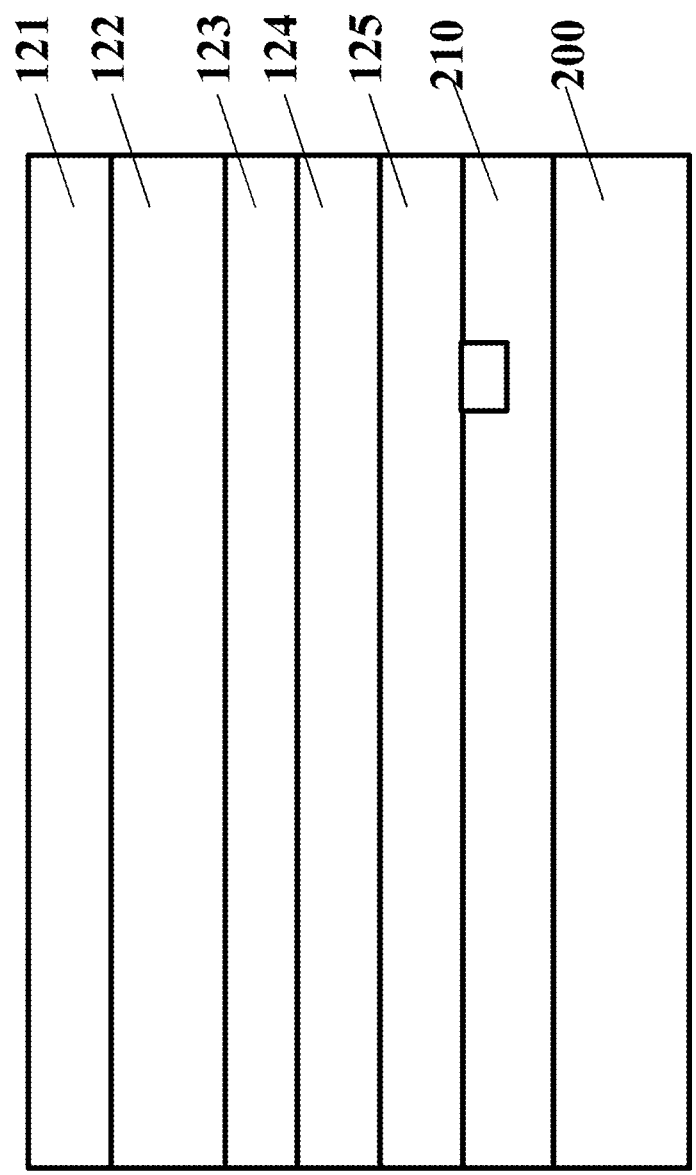
FIG. 7 illustrates a fifth step of fabricating the LED according to embodiment 1.

Step S130: provide a temporary substrate 200, and bond the temporary substrate 200 with the light-emitting epitaxial structure 120 via a bonding layer 210, and remove the growth substrate 100 over the light-emitting epitaxial structure 120 to expose the surface of the n-type semiconductor layer. Specifically, coat the bonding layer 210 over the exposed part of the surface 120a of the light-emitting epitaxial structure 120, the exposed part of the metal mask layer 130 and the electrode material layer 141; then, laminate the temporary substrate 200 over the bonding layer 210, as shown in FIG. 6; in another embodiment, coat the bonding layer 210 over the surface of the temporary substrate 200, and laminate the bonding layer 210 over the surface 120a of the light-emitting epitaxial structure 120, the metal mask layer 130 and the electrode material layer 141 to finish the bonding of the temporary substrate 200 and the light-emitting epitaxial structure 120. Next, remove the growth substrate 100 via chemical etching or grinding method to expose the etching stop layer 110, and remove the etching stop layer 152 via chemical etching or grinding method to expose the n-type ohmic contact layer 121, as shown in FIG. 7. Temperature for laminating the temporary substrate 200 is controlled between 150 and 500° C. (in some embodiments below 300° C.); material of the temporary substrate 200 can be glass, Si, GaAs and the like; material of the bonding layer 210 can be Pb—Sn alloy, Au—Ge alloy, Au—Be alloy, Au—Sn alloy, Sn, In, Pd—In alloy, benzocyclobutene, epoxy resin, Si, polyimide, or rotationally-coated glass polymer, and in some embodiments, benzocyclobutene or epoxy resin.

Figure 8:
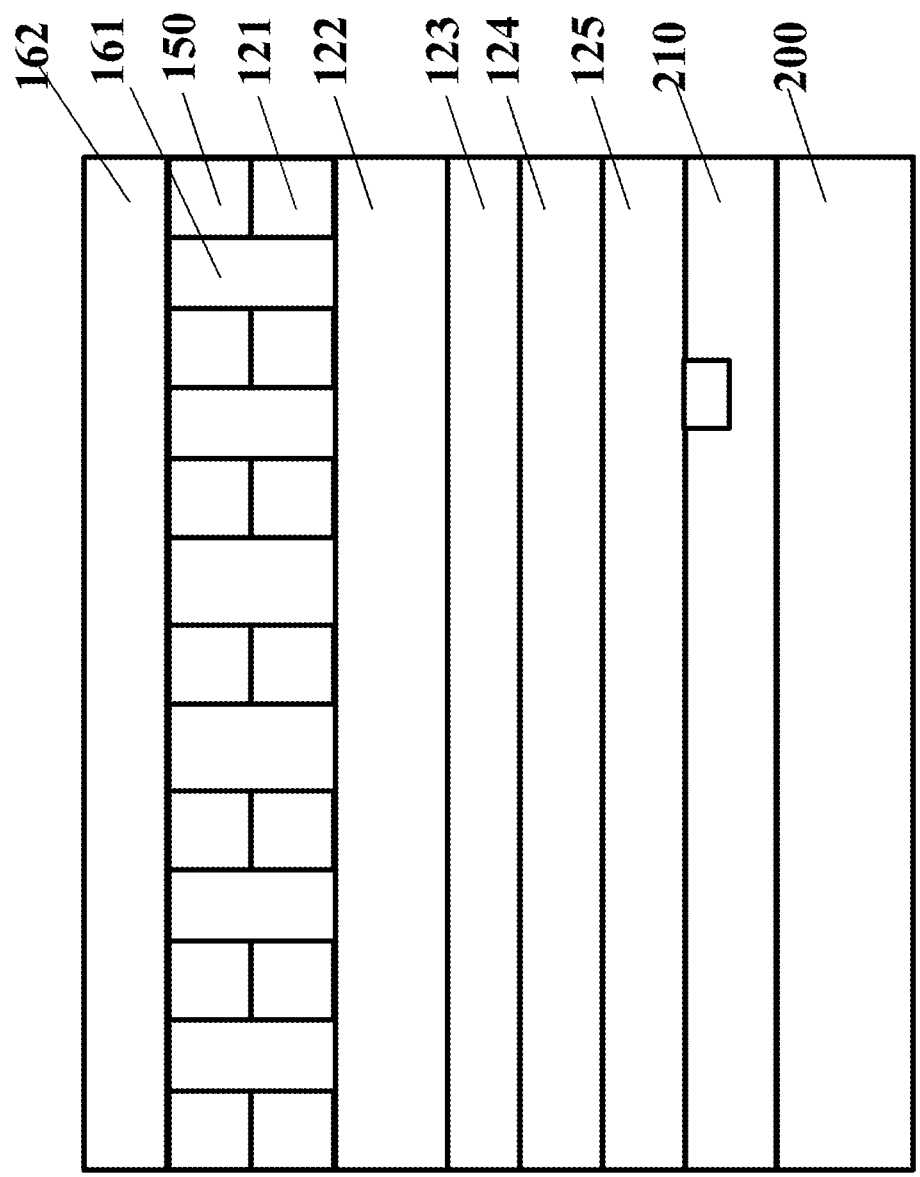
FIG. 8 illustrates a sixth step of fabricating the LED according to embodiment 1.

Step S140: fabricate a patterned ohmic contact layer and a reflector structure over the exposed surface of the light-emitting epitaxial structure. Specifically, pattern the n-type ohmic contact layer 121, and expose the surface of the n-type confinement layer 122, and form an n-type ohmic contact metal layer 150 over the n-type ohmic contact layer 121 to improve electrical quality of the component. Material of the n-type ohmic contact metal layer 150 can be Au—Ge alloy/Au compound material, Au/Au—Ge alloy/Au compound material or Au—Ge alloy/Ni/Au compound material. Next, form a transparent material layer 161 over the exposed part of the surface of the n-type confinement layer 122, wherein, the surface of the transparent material layer is parallel with the surface of the n-type ohmic contact metal layer 150. Next, form a reflecting metal layer 162 over the transparent material layer 161 and the n-type ohmic contact metal layer 150, as shown in FIG. 8. The transparent material layer 161 and reflecting metal layer 162 form an omnidirectional reflectance structure.

Figure 9:
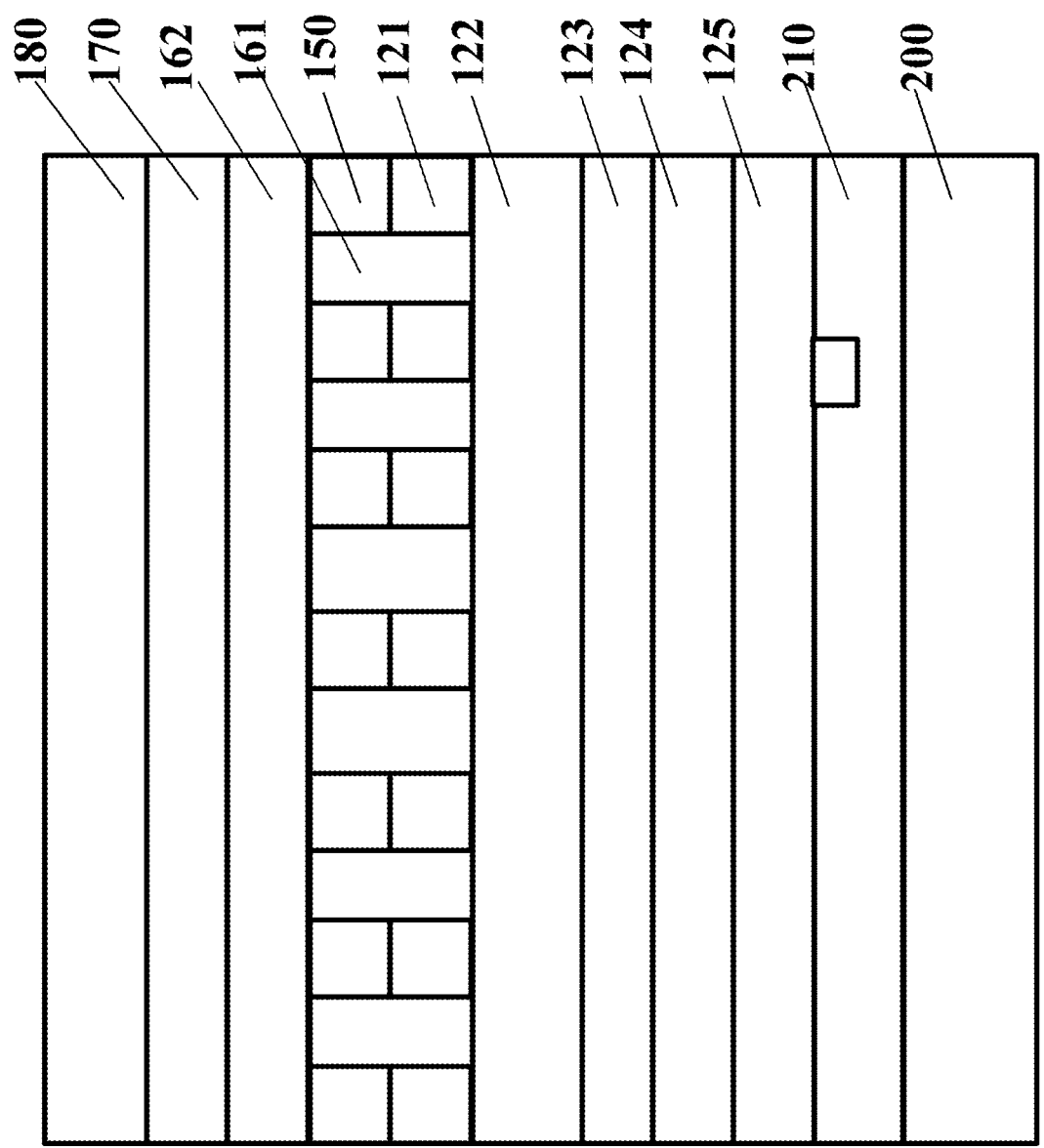
FIG. 9 illustrates a seventh step of fabricating the LED according to embodiment 1.
Figure 10:
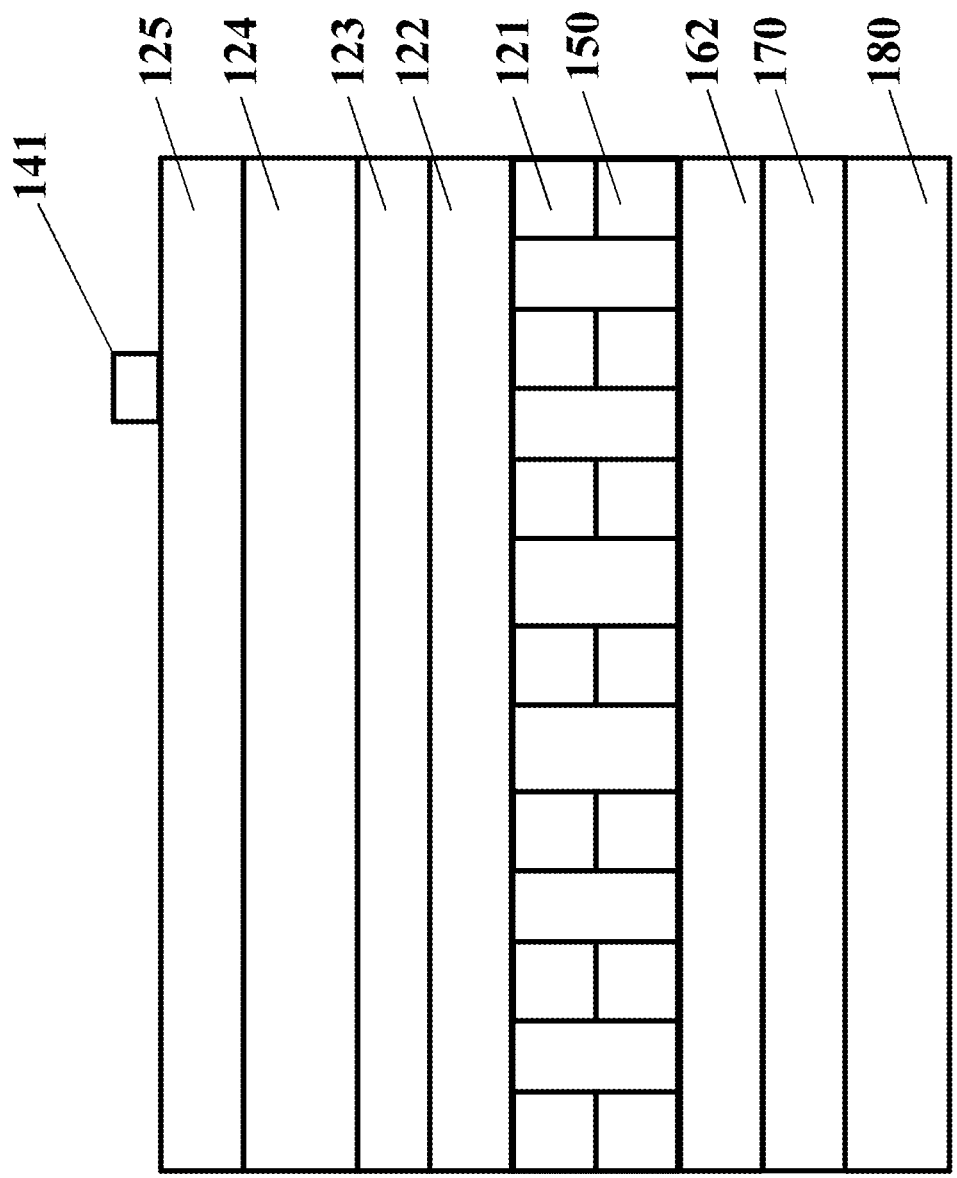
FIG. 10 illustrates an eighth step of fabricating the LED according to embodiment 1.
Figure 11:
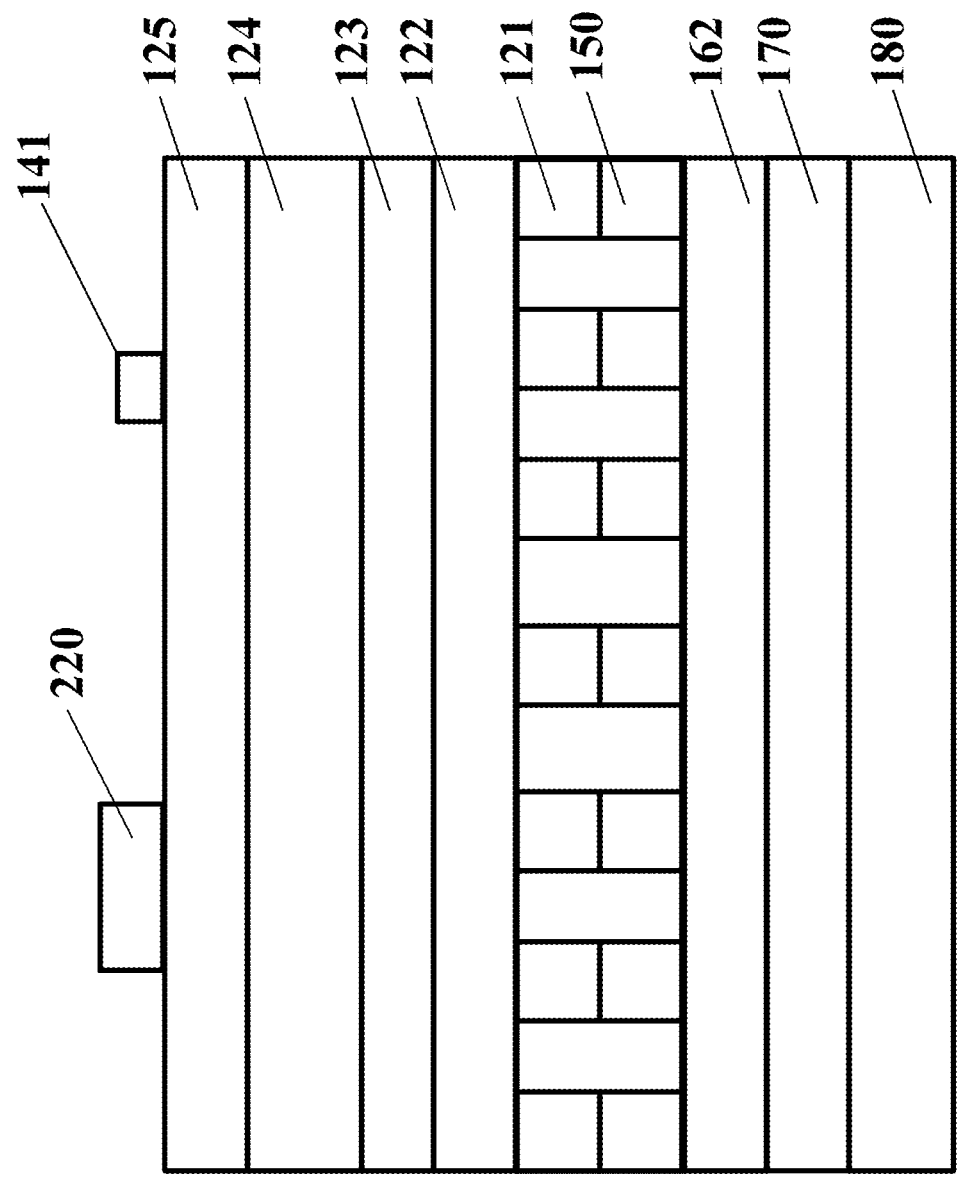
FIG. 11 illustrates a ninth step of fabricating the LED according to embodiment 1.
Figure 12:
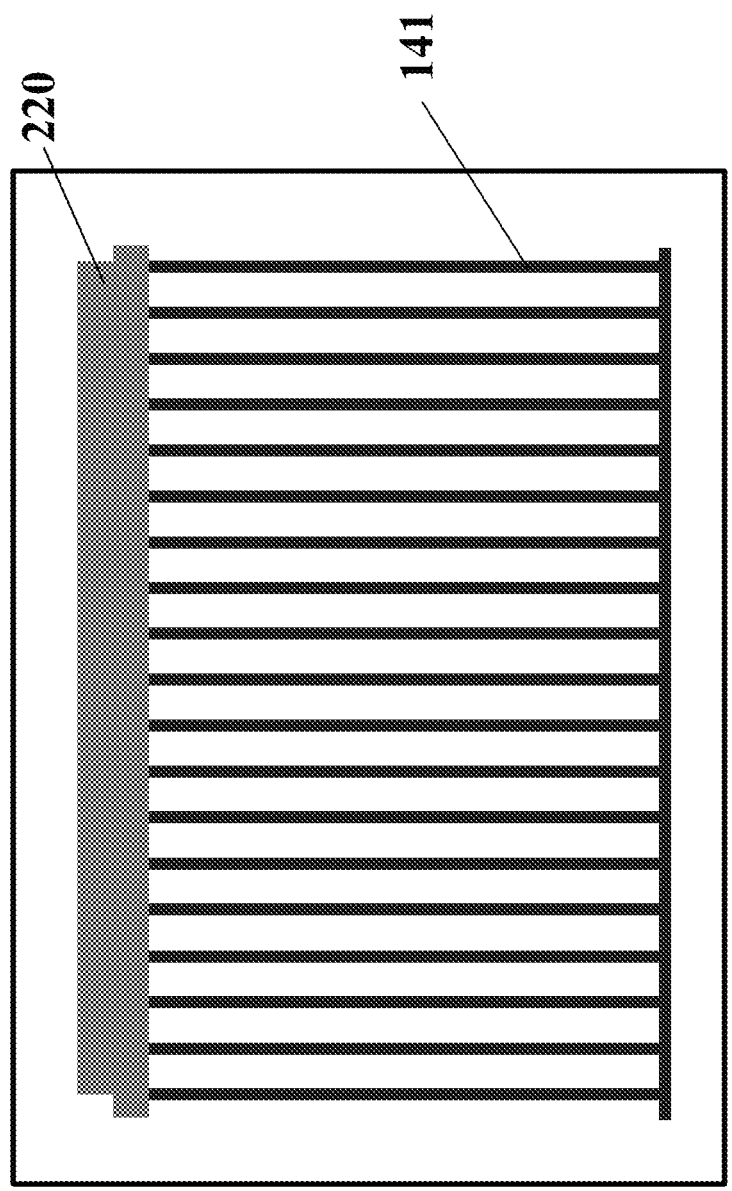
FIG. 12 illustrates a tenth step of fabricating the LED according to embodiment 1.

Step S150: provide a conductive substrate 180, and bond the conductive substrate 200 with the metal reflecting structure via a bonding layer 170, as shown in FIG. 9; material of the material bonding layer 122 of the bonding layer 170 is in some embodiments Pb—Sn alloy, Au—Ge alloy, Au—Be alloy, Au—Sn alloy, Sn, In, Pd—In alloy or Si. Next, remove the temporary substrate 200 and the bonding layer 210 via etching to expose the surface 120a of the light-emitting epitaxial structure 120 and the extended electrode 141, as shown in FIG. 10. In some embodiments, form a photoresist layer 220 as a mask layer in the bonding pad electrode area over the exposed surface of the window layer, as shown in FIGS. 11 and 12.

Figure 13:
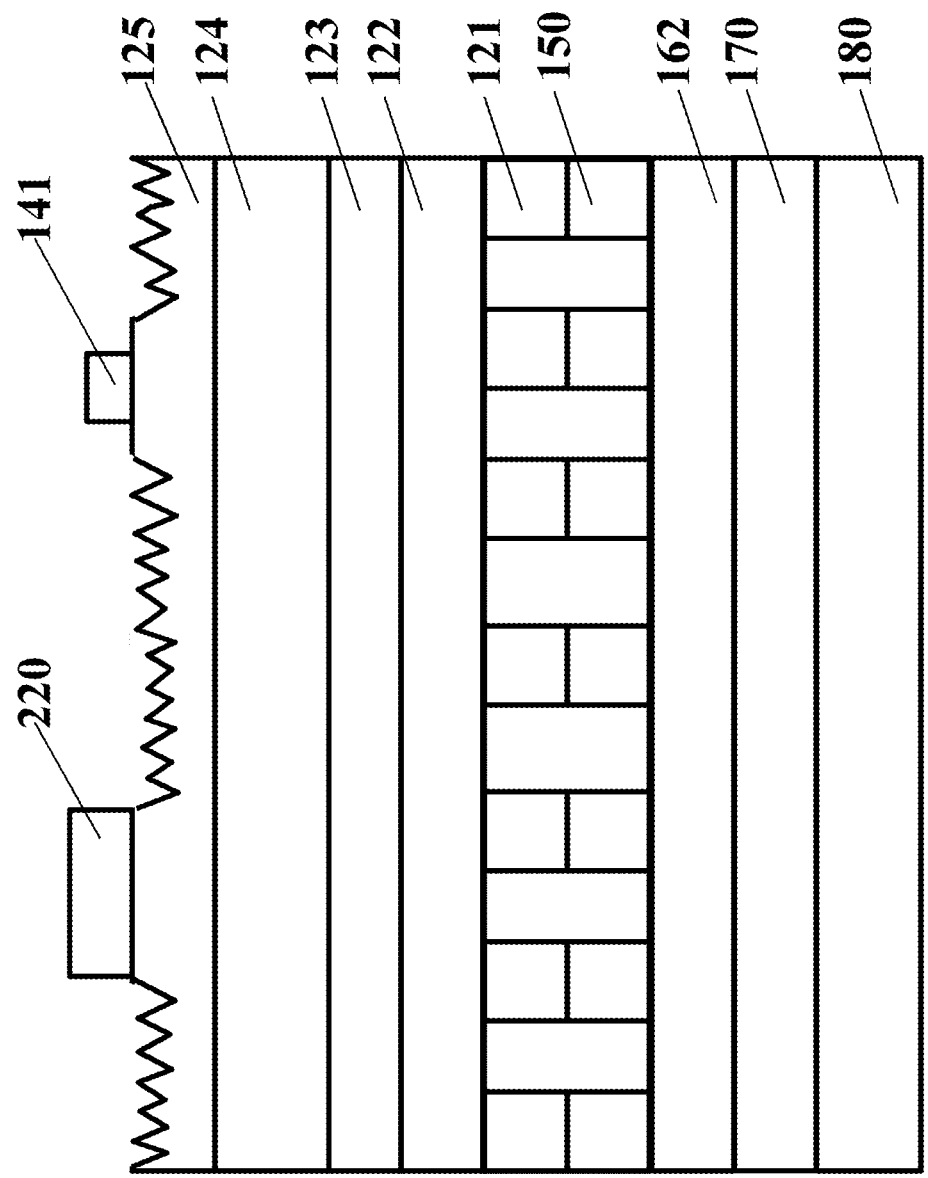
FIG. 13 illustrates a eleventh step of fabricating the LED according to embodiment 1.

Step S160: form a roughening surface via chemical etching of the exposed surface of the window layer, as shown in FIG. 13. Specifically: Add at least 10 g I2 iodine powder into 1,600 ml $CH_3COOH$ and mix them; after iodine powder is completely dissolved under 40-45° C., add mixture solution of HF, $HNO_3$ and $CH_3COOH$ with volume ratio of 3:2:4, and control temperature at 35-40° C.; next, add the aforesaid light-emitting epitaxial structure into the prepared solution, and roughen for 1-2 min. Iodine powder has dual effects of etching and masking. Therefore, iodine powder is in some embodiments dissolved completely as fine as possible.

Figure 14:
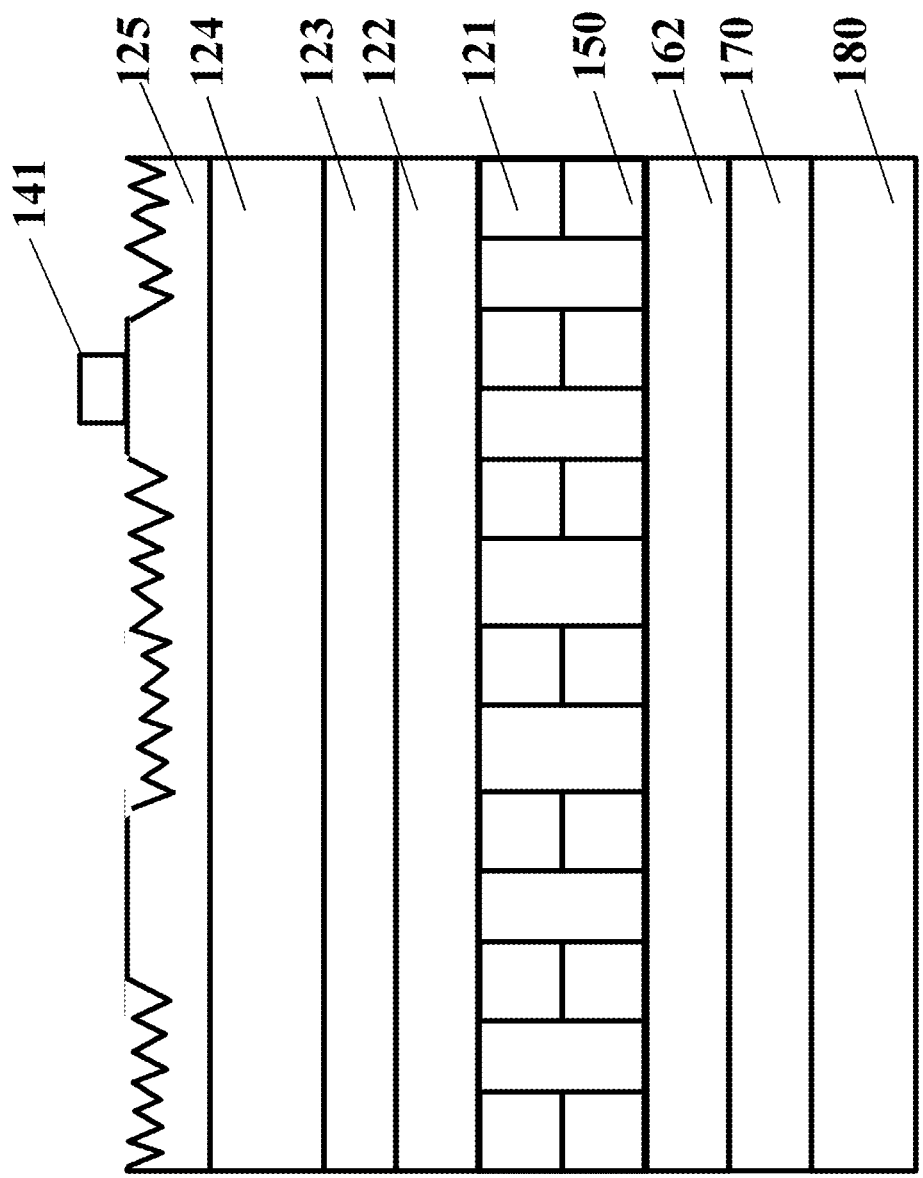
FIG. 14 illustrates a twelfth step of fabricating the LED according to embodiment 1.
Figure 15:
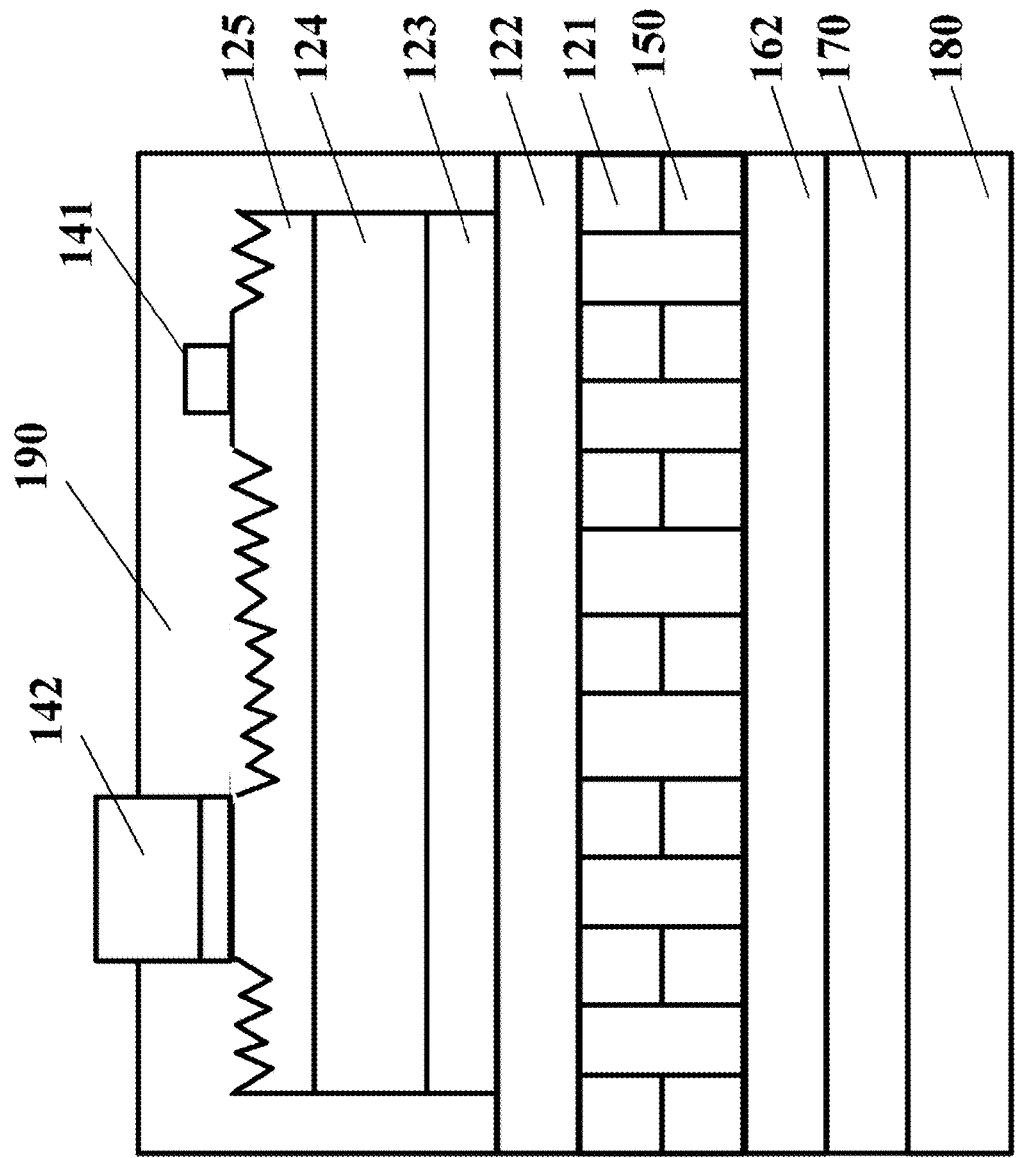
FIG. 15 illustrates a thirteenth step of fabricating the LED according to embodiment 1.

Step S170: remove the photoresist layer 220 after roughening, and expose the p-type window layer, as shown in FIG. 14. In some embodiments, cover an insulating protection layer 190 over the surface of the light-emitting epitaxial structure and the surface of the extended electrode 141; then, form a high-resistance current blocking layer 143 and a bonding pad electrode 142 in the bonding pad electrode area to form a p-side-up light-emitting diode device, as shown in FIG. 15. The extended electrode 141 and the bonding pad electrode 142 form a closed structure.

The fabrication method of a light-emitting diode of the embodiment, the bonding pad electrode and the extended electrode are fabricated separately, namely, the extended electrode is fabricated before roughening while the bonding pad electrode is fabricated after roughening. This prevents the bonding pad electrode area and the extended electrode area from forming a closed loop during roughening etching. As a result, charged particles in the roughening solution would undergo random and free motion instead of directional motion as influenced by magnetic field, thus improving the roughening ratio of the light emitting surface and the light extraction rate of LED.

Figure 16:
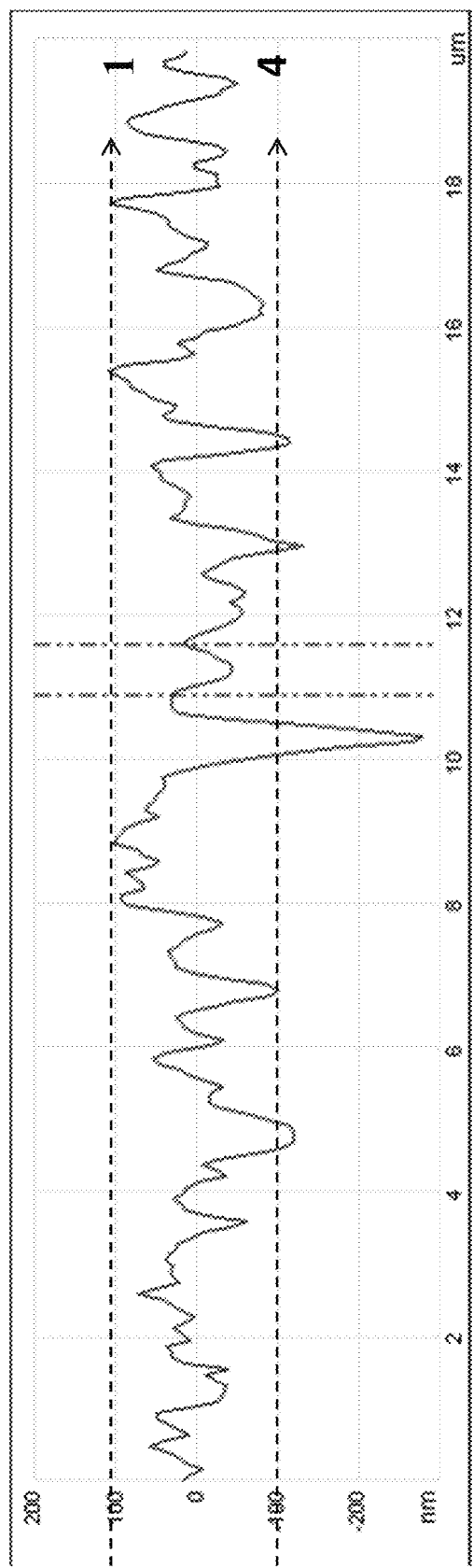
FIG. 16 shows the roughening status of a p-side-up light-emitting diode fabricated from a conventional fabrication method.
Figure 17:
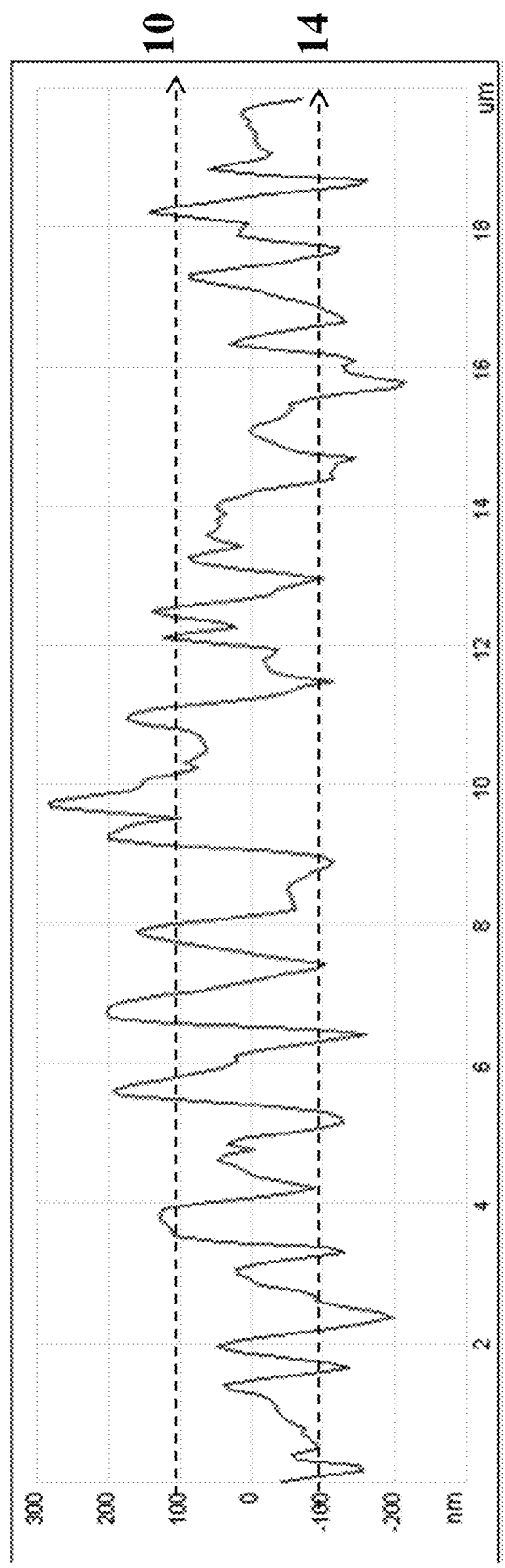
FIG. 17 shows the roughening status of a light-emitting diode fabricated according to Embodiment 1.

FIGS. 16 and 17 show the roughening statues of the roughening surfaces of p-side-up light-emitting diodes fabricated according to different fabrication methods, wherein, FIG. 16 shows the process of fabricating both the bonding pad electrode and the extended electrode before roughening (namely, conventional process mentioned in the background technology), and FIG. 17 shows the fabrication method according to the Embodiment 1 of the present disclosure (namely: fabricate the extended electrode before roughening, and fabricate the bonding pad electrode after roughening). Cut roughening patterns in same unit area (20 μm×20 μm) for peak measurement. Number of protrusion portions and recess portions with peak value above 100 nm in FIG. 16 are 1 and 4 respectively; however, number of protrusion portions and recess portions with peak value above 100 nm in FIG. 17 are 10 and 14 respectively. By comparing FIGS. 16 and 17, the density and roughening depth-to-width ratio of the roughening surface of the light-emitting diode obtained through the fabrication method in Embodiment 1 are greatly improved, thus improving luminance of the light-emitting diode.

Figure 18:
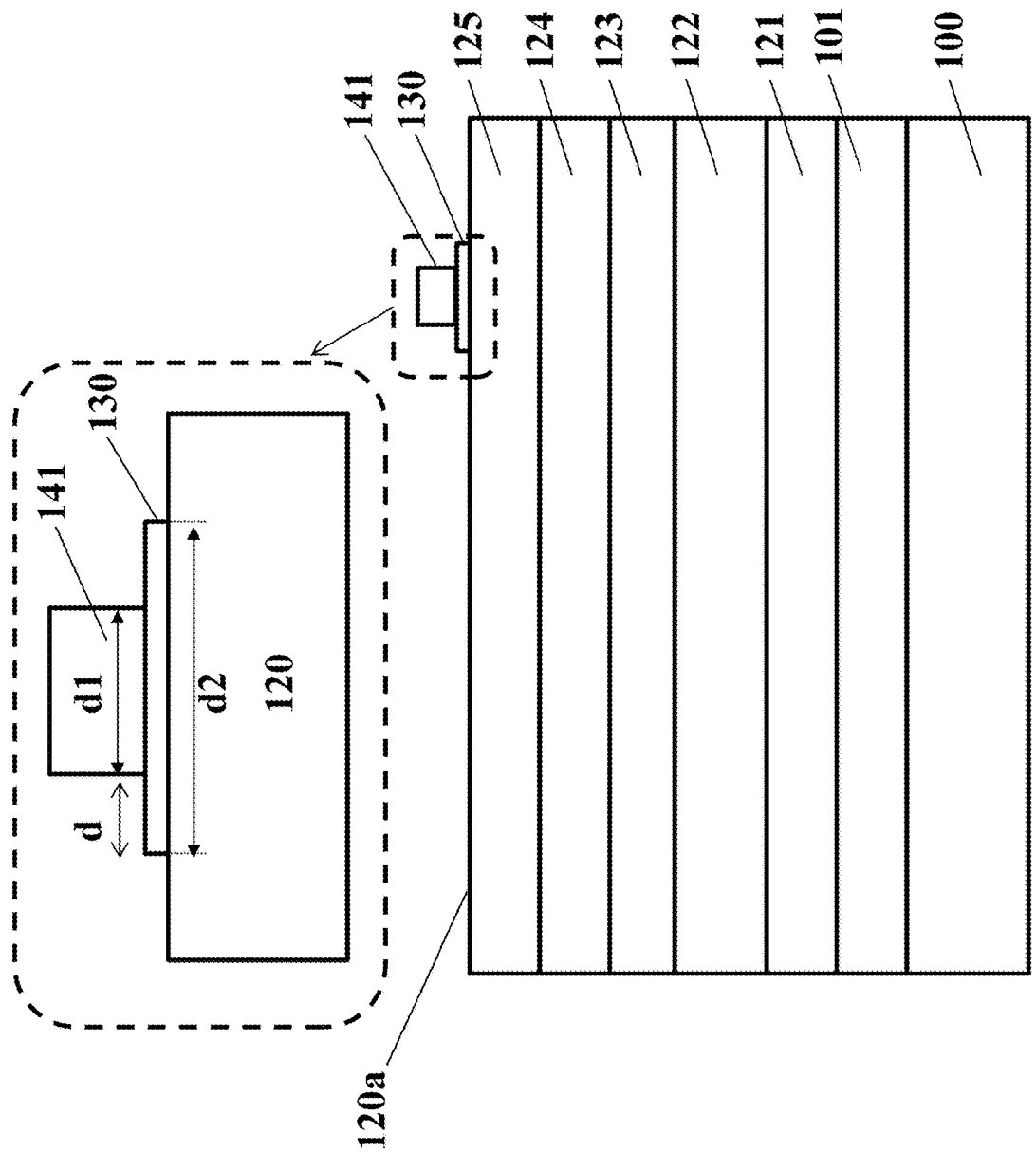
FIG. 18 illustrates a first step of fabricating the LED according to embodiment 2.
Figure 19:
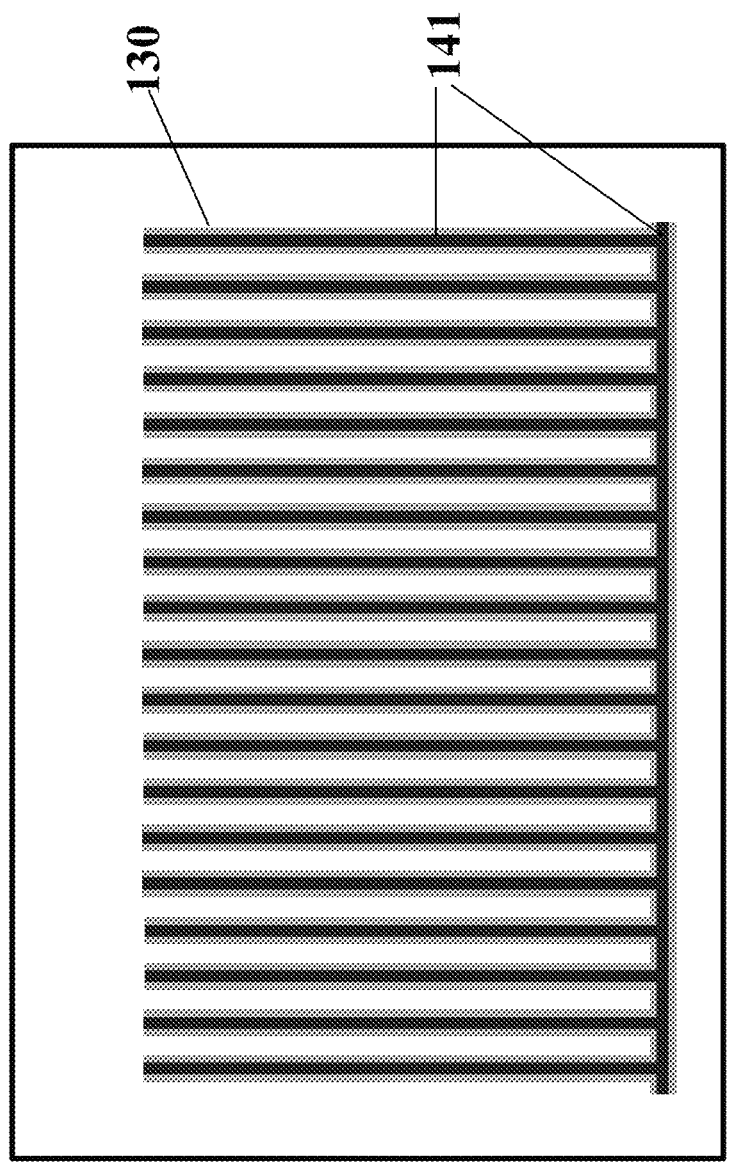
FIG. 19 illustrates a second step of fabricating the LED according to embodiment 2.
Figure 20:
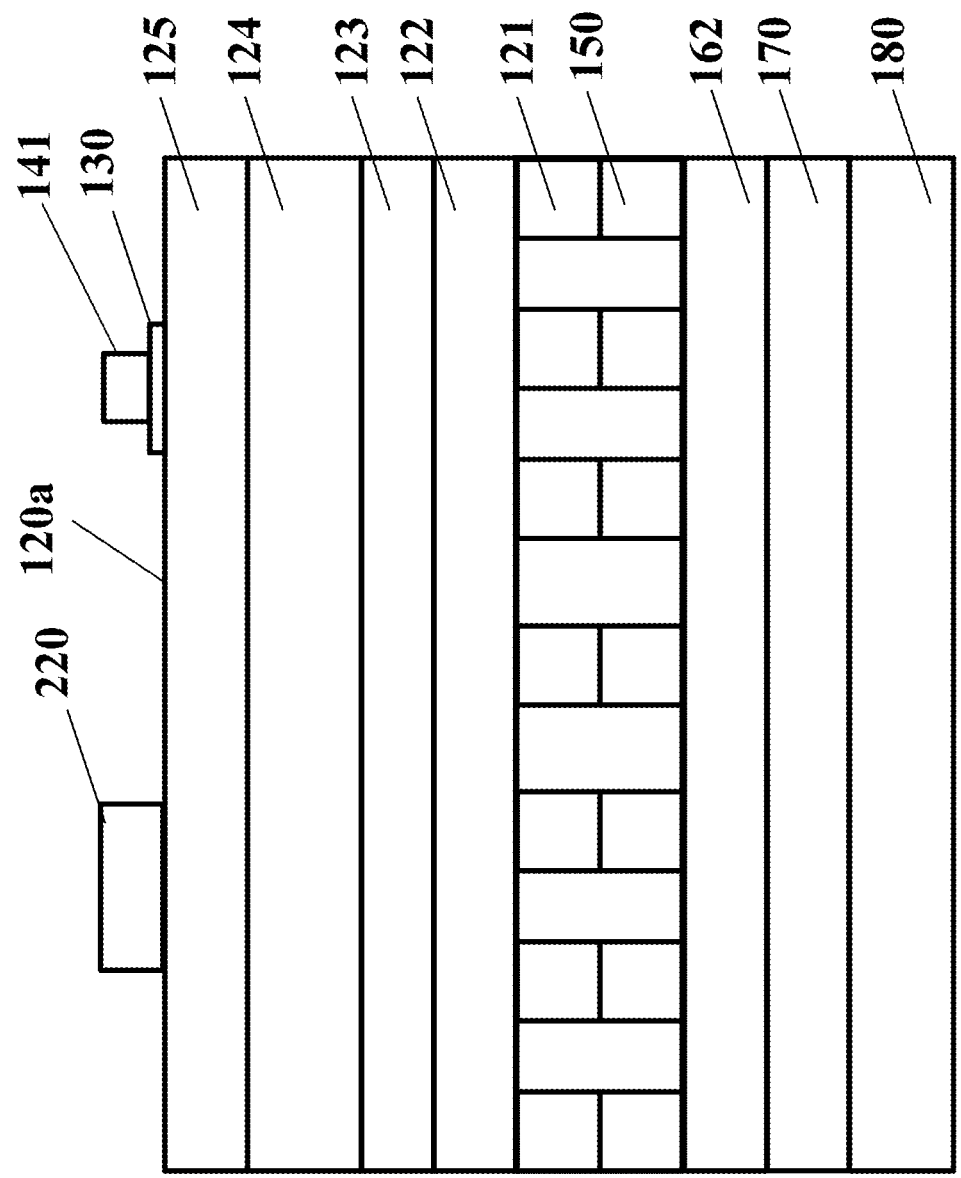
FIG. 20 illustrates a third step of fabricating the LED according to embodiment 2.
Figure 21:
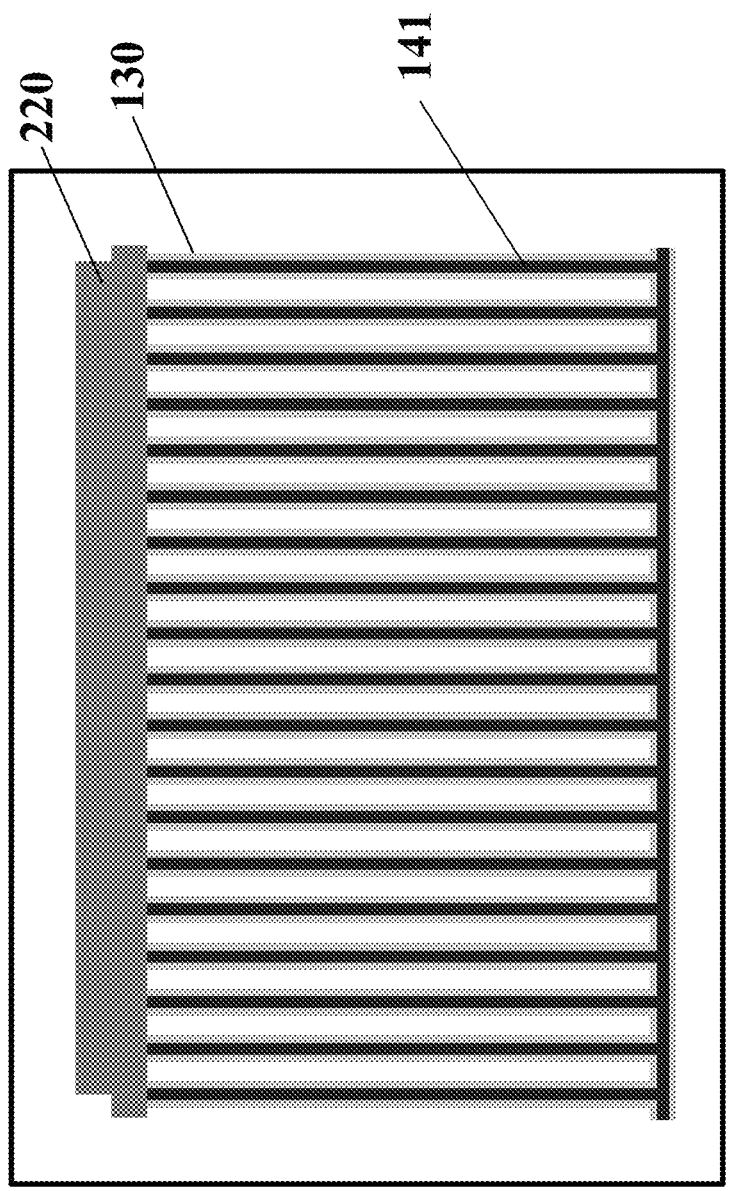
FIG. 21 illustrates a fourth step of fabricating the LED according to embodiment 2.
Figure 22:
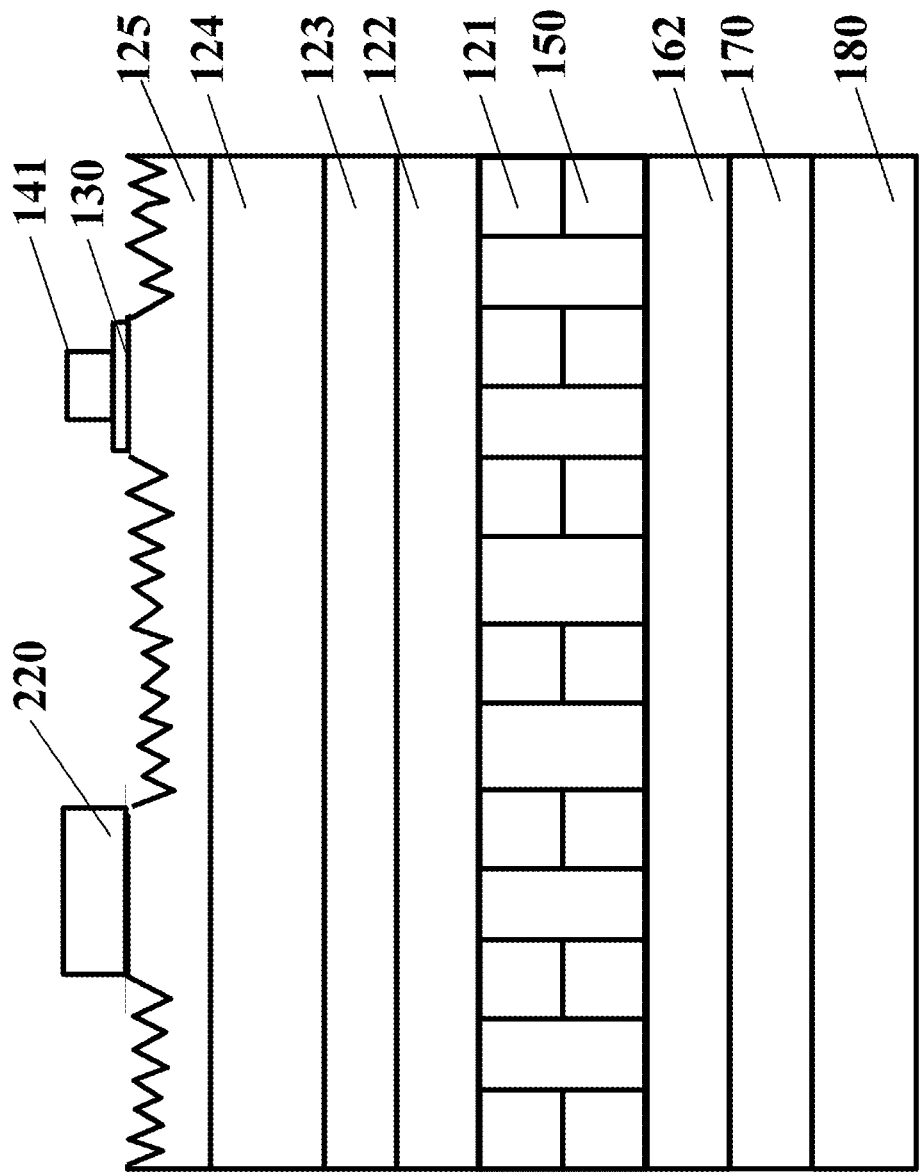
FIG. 22 illustrates a fifth step of fabricating the LED according to embodiment 2.
Figure 23:
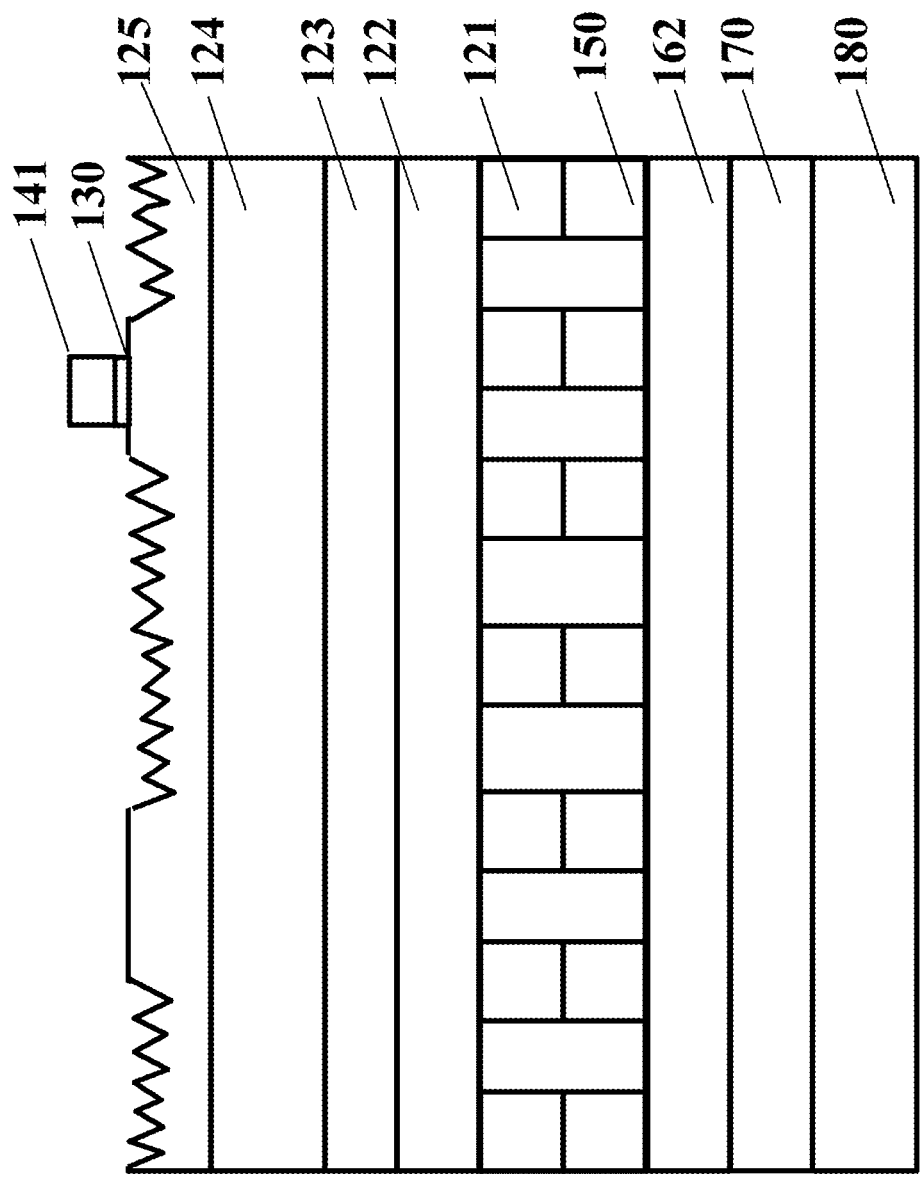
FIG. 23 illustrates a sixth step of fabricating the LED according to embodiment 2.
Figure 24:
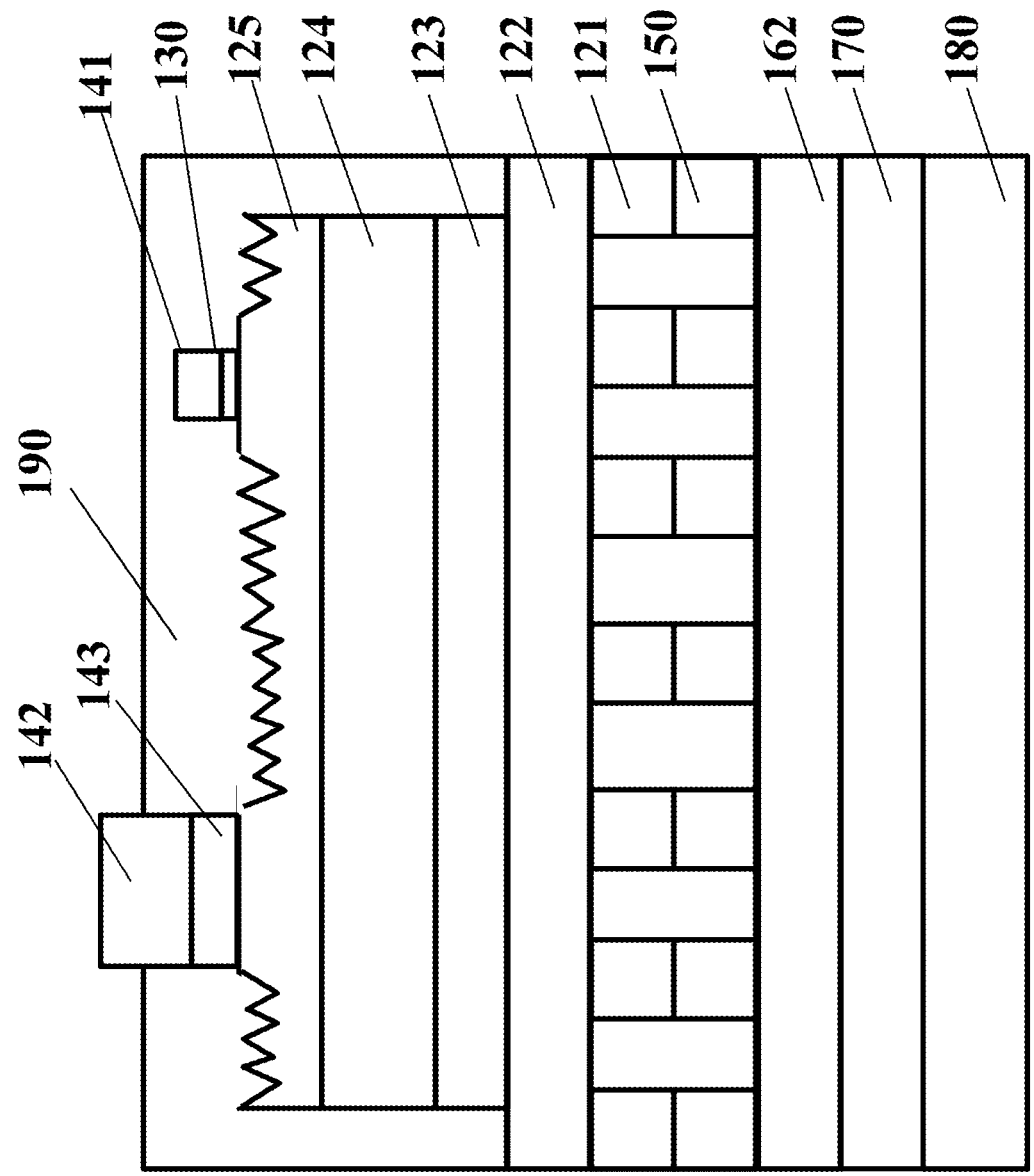
FIG. 24 illustrates a seventh step of fabricating the LED according to embodiment 2.

FIGS. 18-24 are partial process diagrams of a fabrication method of light-emitting diode according to a second preferred embodiment of the present disclosure. As a variant of the first preferred embodiment, at first, form a metal mask layer 130 over the surface of the window layer 1250 in Step S120, and then fabricate an extended electrode 141 over the metal mask layer 130, as shown in FIG. 18, wherein, the metal mask layer 130 is larger than the extended electrode 141, as shown in FIG. 19; after S150 is completed, form a photoresist layer 220 as the mask layer in the bonding pad electrode area over the surface 120a of the epitaxial structure 120, as shown in FIGS. 20 and 21; next, perform roughening treatment in S250, as shown in FIG. 22; remove the photoresist layer 220 and the residual metal mask layer 130 with different solutions in S260, as shown in FIG. 23; then, cover an insulating protection layer 190 over part of the surface of the light-emitting epitaxial structure and the surface of the extended electrode 141 and reserve a bonding pad electrode area; then, form a high-resistance current blocking layer 143 and a bonding pad electrode 142 in the bonding pad electrode area to form a p-side-up light-emitting diode device, as shown in FIG. 24.

In this embodiment, following factors should be considered for the metal mask layer 130: (1) the metal mask layer can serve as the mask layer to protect the epitaxial layer under the extended electrode 141 to avoid lateral erosion of the epitaxial layer under the extended electrode 141b; therefore, the edge of the metal mask layer 130 needs to extend beyond the edge of extended electrode 141 by a distance d of at least 2 µm, and in some embodiments 2-5 µm; for example, if width dl of the extended electrode 141 is 6 µm, and width of the metal mask layer 130 is 10 µm, the distance d beyond which the edge of the metal mask layer 130 extends the edge of the extended electrode 141 is 2 µm; (2) the metal mask layer in the non-electrode area is to be removed after roughening; for this reason, the metal mask layer shall not be too thick and shall be easily-removed material, such as Au, Cr, Ni, Ti or Pd and the like; the thickness can be 10-200 nm, and in some embodiments 50-100 nm; (3) as the metal mask layer 130 is between the epitaxial layer 125 and the electrode material layer 141, the material capable for forming ohmic contact with the epitaxial material layer are selected to form ohmic contact between the metal mask layer 130 and the light-emitting epitaxial structure 120. In this embodiment, material of the metal mask layer 130 is Au, which forms good ohmic contact with the epitaxial layer, and is easily removed by chemical etching solution.

In this embodiment, the fabrication of the mask layer is prior to the substrate bonding process, which eliminates the affect from dislocation of yellow light alignment; in addition, the mask layer made of metal is not etched during roughening, which ensures ohmic contact while addressing lateral erosion of the extended electrode and avoiding fragile metal contact or lift-off.

Figure 25:
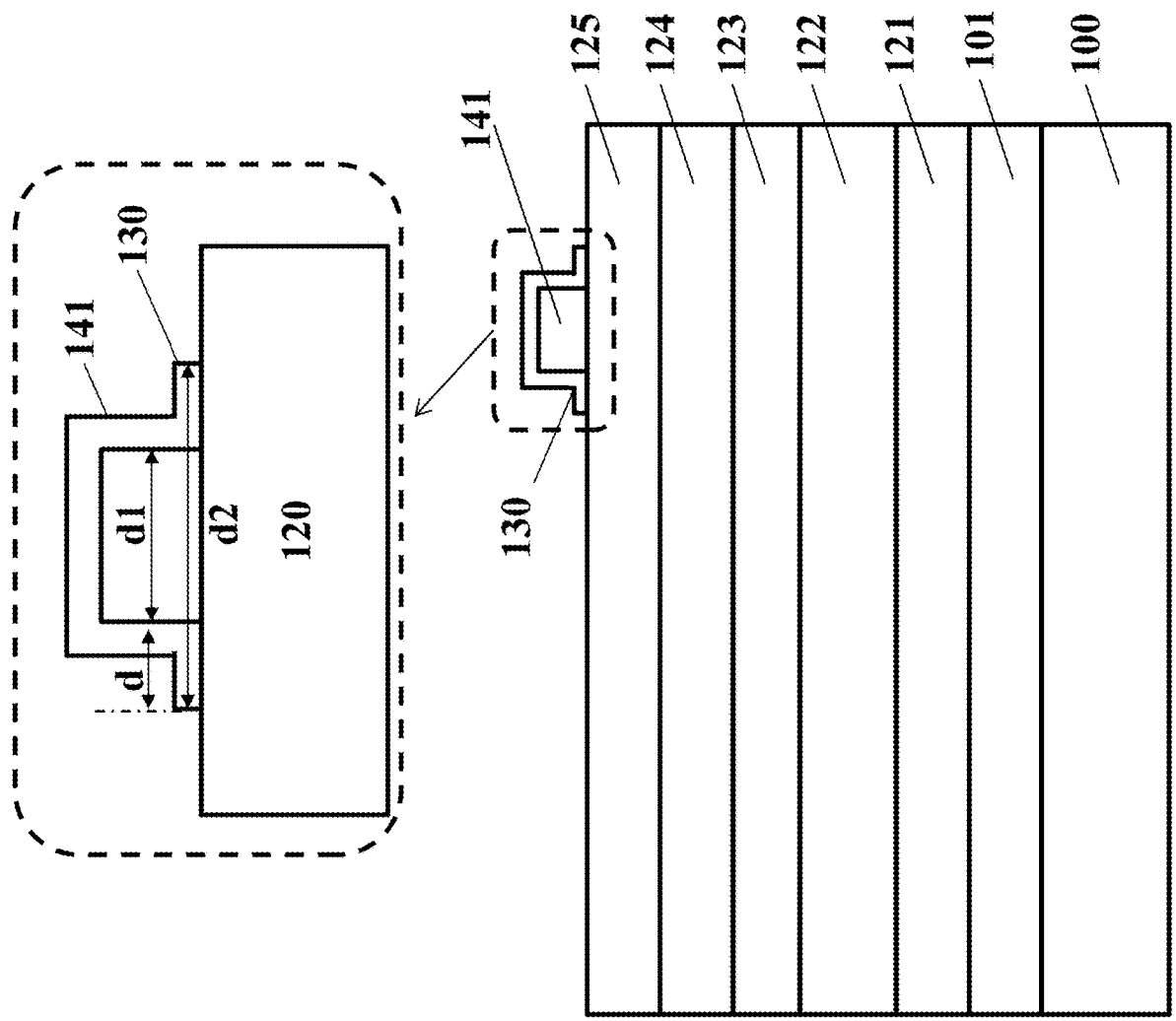
FIG. 25 illustrates a first step of fabricating the LED according to embodiment 3.
Figure 26:
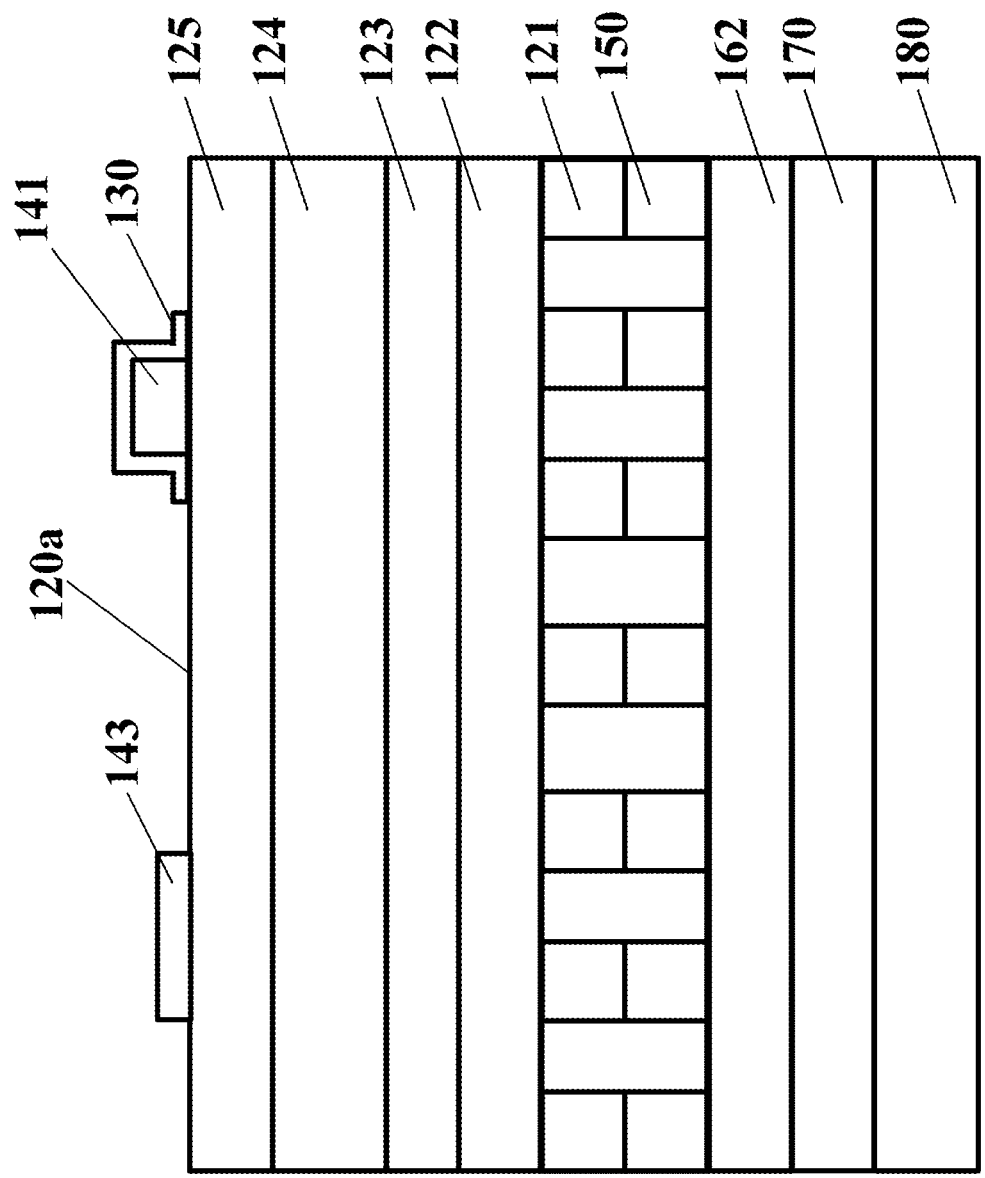
FIG. 26 illustrates a second step of fabricating the LED according to embodiment 3.
Figure 27:
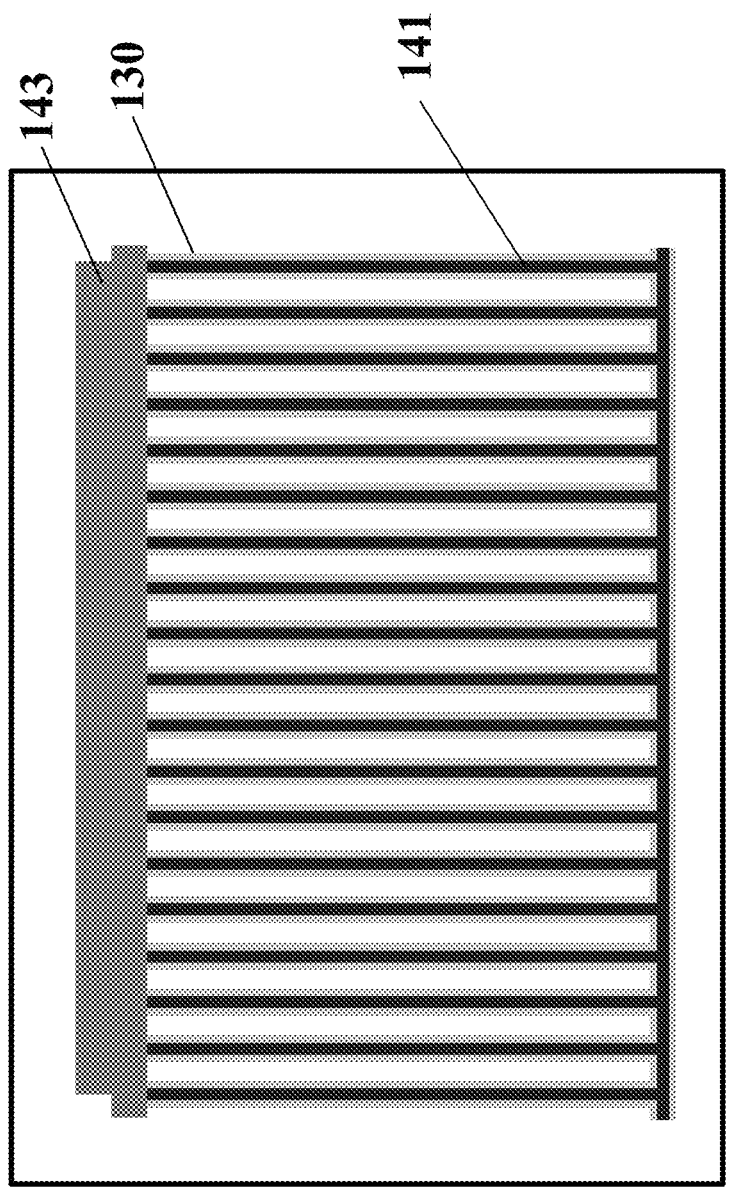
FIG. 27 illustrates a third step of fabricating the LED according to embodiment 3.
Figure 28:
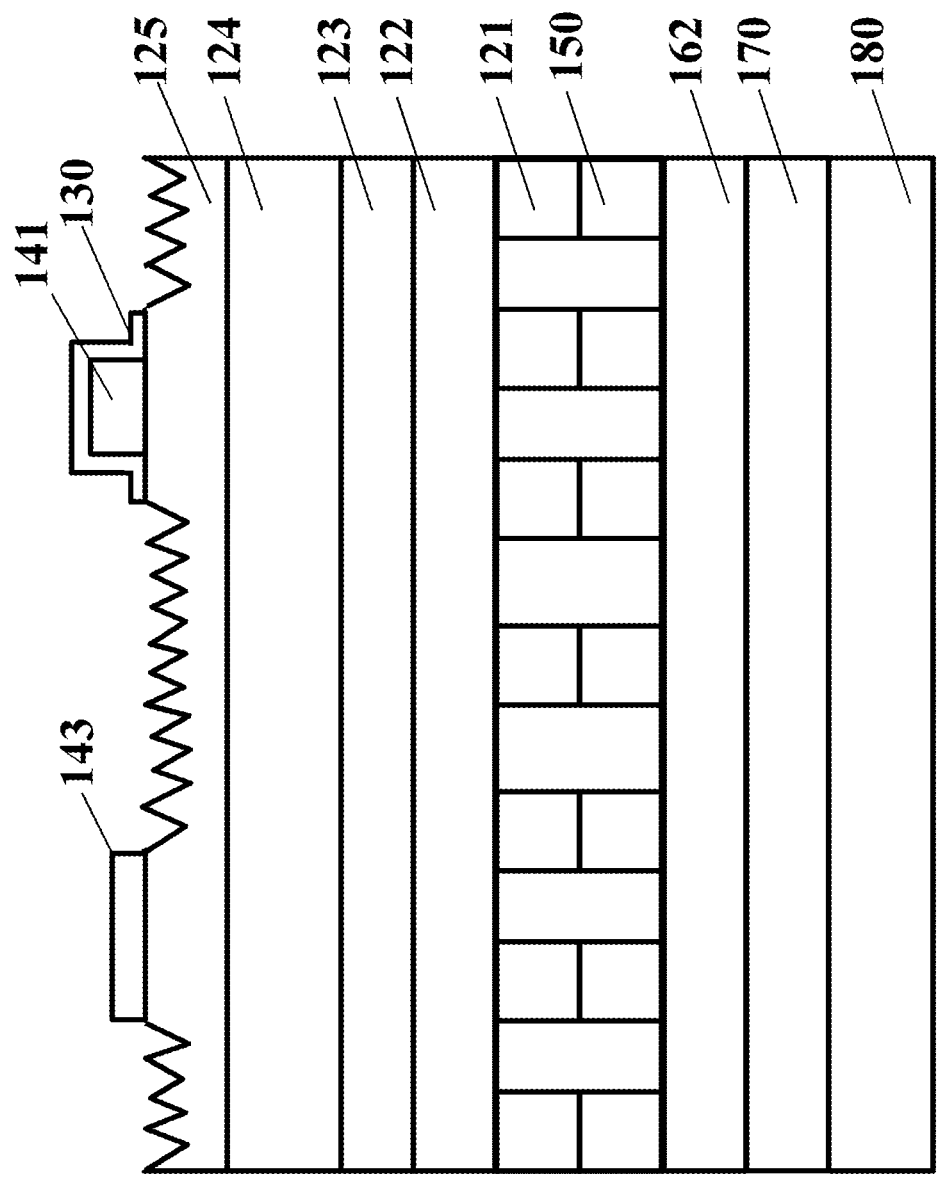
FIG. 28 illustrates a fourth step of fabricating the LED according to embodiment 3.
Figure 29:
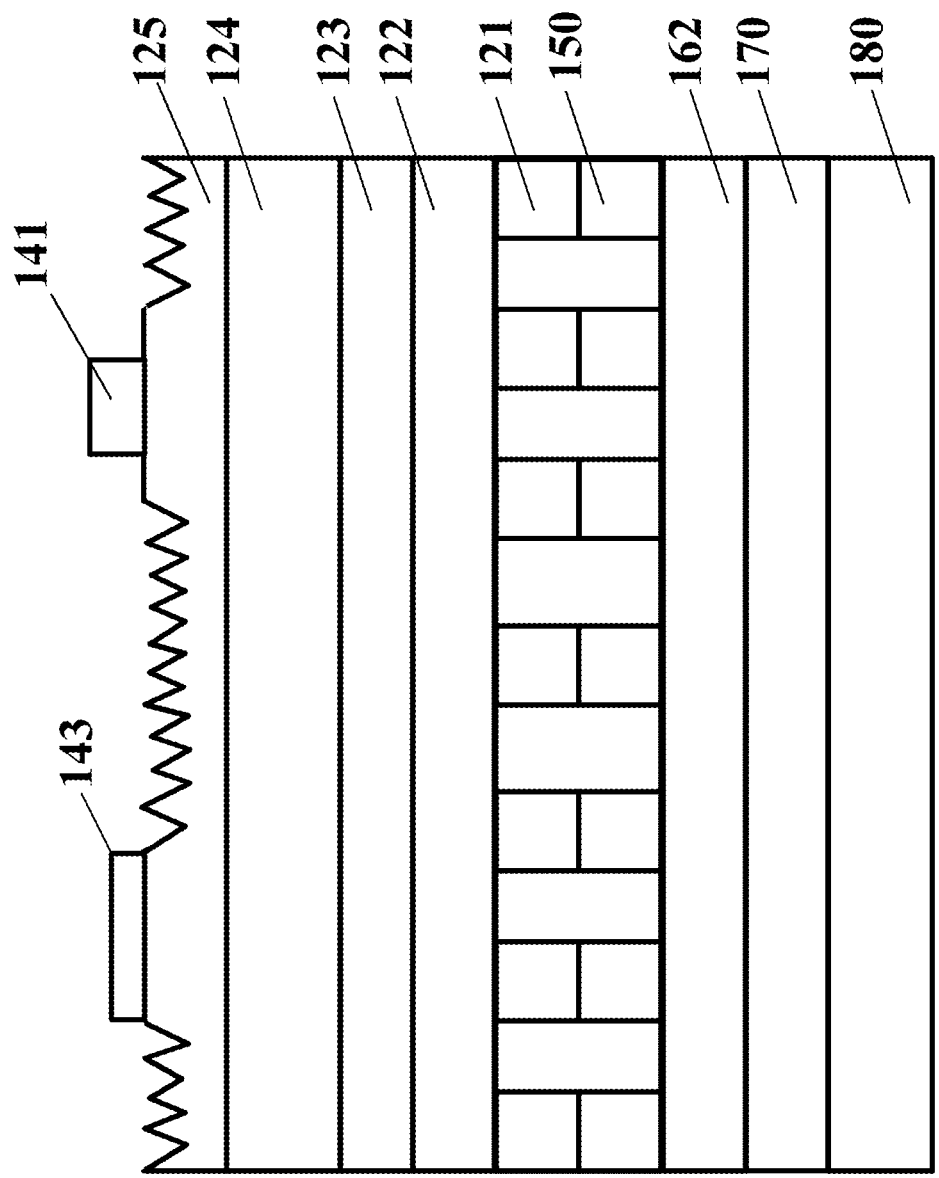
FIG. 29 illustrates a fifth step of fabricating the LED according to embodiment 3.
Figure 30:
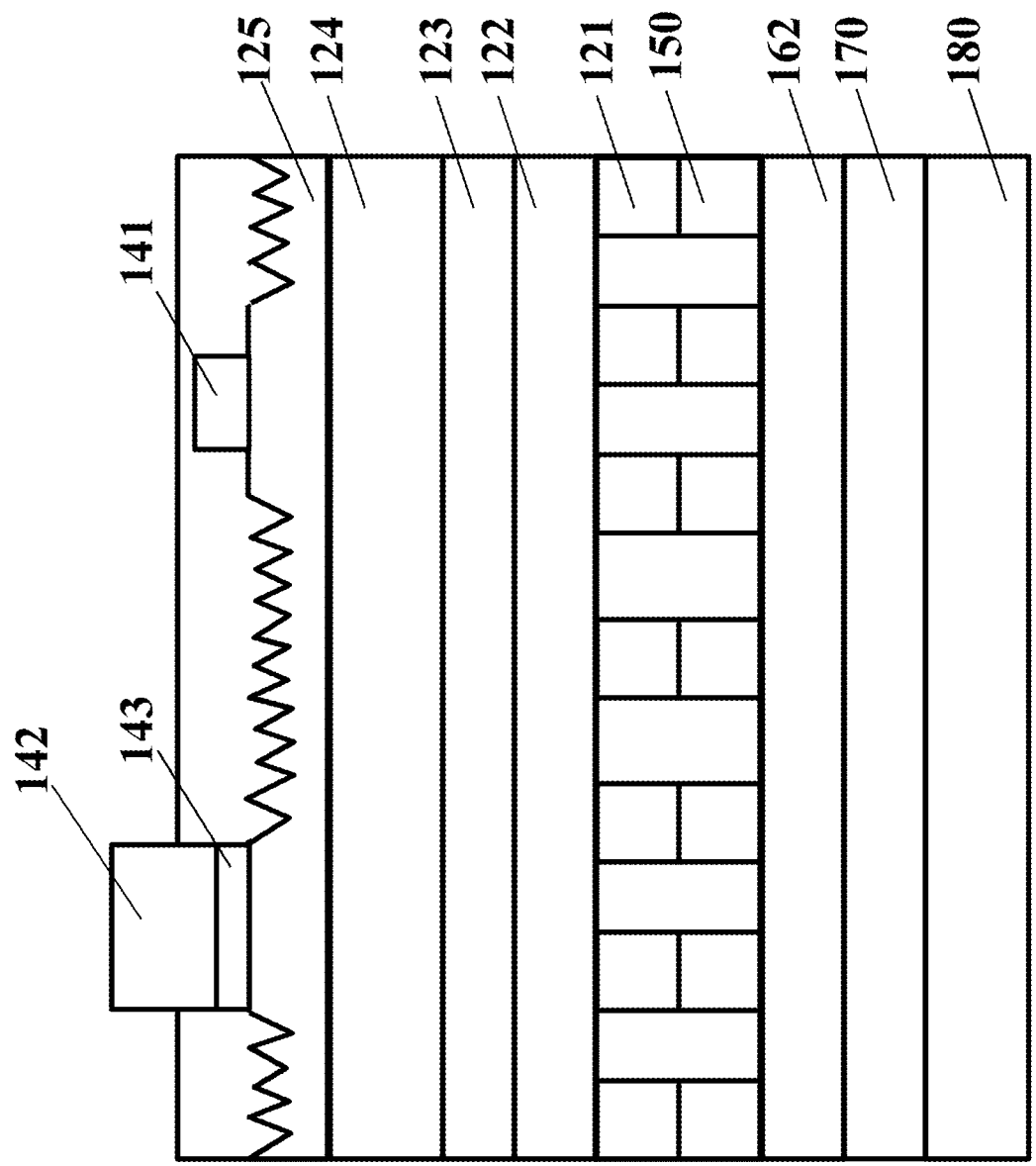
FIG. 30 illustrates a sixth step of fabricating the LED according to embodiment 3.

FIGS. 25-30 are partial process diagrams of a fabrication method of light-emitting diode according to a third preferred embodiment of the present disclosure. Different from the second preferred embodiment, at first, form an extended electrode 141 over the surface of the light-emitting epitaxial structure in S120 of this embodiment; next, cover a metal mask layer 130 over the extended electrode 141, as shown in FIG. 25; after Step S150 is finished, form an insulating layer 143 as the mask layer in the bonding pad electrode area over the surface 120a of the epitaxial structure 120, as shown in FIGS. 26 and 27; the insulating layer 143 can be a single layer structure, such as silicon nitride or silicon oxide and other insulating materials, and can be a multilayer structure, such as a DBR reflector structure laminated with insulating material layers with high and low refractive index; etch the exposed surface of the window layer with roughing solution in S160, as shown in FIG. 28; generally, use roughening solution that is not likely to damage the insulating layer, which can be mixture solution of HCl: $HNO_3$: $H_2O$ or mixture solution of KOH: KHFe and the like; remove the metal mask layer 130 to expose the extended electrode 141 in Step S170, as shown in FIG. 25, and then cover an insulating protection layer 190 over part of the surface of the light-emitting epitaxial structure and the surface of the extended electrode 141; then, fabricate a bonding pad electrode 142 above the insulating layer 143 to form a p-side-up light-emitting diode device, as shown in FIG. 30.

In this embodiment, the metal mask layer 130 is preferred to be Cr for the following reasons: firstly, Cr would not be eroded by the roughening etching solution, which avoids lateral erosion of the lower area; secondly, Cr as a kind of inert metal, would neither diffuse nor damage other structures of the extended electrode; and thirdly, it is likely to be removed via a chemical etching. Then, the insulating layer 143 is used as the roughening mask layer in the bonding pad electrode area, and directly form a bonding pad electrode above the insulating layer 143 after roughening, which serves as a current blocking layer that eliminates current injection under the bonding pad electrode and also forms a reflector electrode.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a light-emitting diode, the method comprising:
   (1) providing an epitaxial structure including a growth substrate, a first-type semiconductor layer, an active layer and a second-type semiconductor layer;
   (2) forming an extended electrode over a surface of the second-type semiconductor layer and performing thermal treatment to form ohmic contact with the second-type semiconductor layer;
   (3) providing a temporary substrate bonded with the epitaxial structure, and removing the growth substrate to expose a surface of the first-type semiconductor layer;
   (4) forming an ohmic contact layer, a mirror layer and a bonding layer over the exposed surface of the first-type semiconductor layer;
   (5) providing a conductive substrate bonded with the bonding layer, and removing the temporary substrate to expose a portion of the surface of the second-type semiconductor layer and the extended electrode;
   (6) forming a roughening surface via etching of the exposed second-type semiconductor layer; and
   (7) forming a bonding pad electrode over the surface of the second-type semiconductor layer, wherein the bonding pad electrode forms a closed loop with the extended electrode;

wherein the extended electrode is formed prior to the forming the roughening surface via etching in step (6), and the bonding pad electrode is formed after the roughening surface via etching in step (6), to thereby avoid forming a magnetic field resulting from the closed loop causing charged particles in a roughening solution to drift during the roughening.

2. The fabrication method of claim 1, wherein:

a metal mask layer is formed above or below the extended electrode in step (2);

area of the metal mask layer is larger than that of the extended electrode.

3. The fabrication method of claim 2, wherein a thickness of the metal mask layer formed in step (2) is 10-200 nm.

4. The fabrication method of claim 2, wherein an edge of the metal mask layer formed in step (2) extends beyond an edge of the extended electrode by at least 2 µm.

5. The fabrication method of claim 2, wherein the metal mask layer formed in step (2) is composed of at least one of Au, Cr, Ni, Ti, or Pd.

6. The fabrication method of claim 1, wherein a thermal treatment temperature in step (2) is above 300° C.

7. The fabrication method of claim 1, wherein the extended electrode is directly formed as a mask layer in step (6) for the roughening etching of the surface of the second-type semiconductor layer.

8. The fabrication method of claim 1, wherein a mask layer of photoresist layer is formed in a bonding pad electrode area in step (6) prior to the etching.

9. The fabrication method of claim 1, wherein:

an insulating layer is formed as a mask layer in a bonding pad electrode area prior to the etching in step (6); and the bonding pad electrode is directly formed over the insulating layer in step (7).

10. The fabrication method of claim 1, wherein the etching is chemical etching.

* * * * *